United States Patent
Ohkubo et al.

(10) Patent No.: US 7,256,456 B2
(45) Date of Patent: Aug. 14, 2007

(54) SOI SUBSTRATE AND SEMICONDUCTOR INTEGRATED CIRCUIT DEVICE

(75) Inventors: Hiroaki Ohkubo, Kanagawa (JP); Masayuki Furumiya, Kanagawa (JP); Ryota Yamamoto, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/739,166

(22) Filed: Dec. 19, 2003

(65) Prior Publication Data
US 2004/0129977 A1   Jul. 8, 2004

(30) Foreign Application Priority Data
Dec. 20, 2002 (JP) ............... 2002-370971

(51) Int. Cl.
  H01L 27/12    (2006.01)
  H01L 27/01    (2006.01)
  H01L 31/0392  (2006.01)
(52) U.S. Cl. .............. 257/347; 257/348; 257/349; 257/350; 257/351
(58) Field of Classification Search ............. 257/350, 257/351, 347, 348, 349
  See application file for complete search history.

(56) References Cited

U.S. PATENT DOCUMENTS

| | | | |
|---|---|---|---|
| 5,510,630 A * | 4/1996 | Agarwal et al. ........... | 257/77 |
| 5,661,329 A * | 8/1997 | Hiramoto et al. .......... | 257/510 |
| 5,994,759 A * | 11/1999 | Darmawan et al. ........ | 257/538 |
| 6,071,803 A * | 6/2000 | Rutten et al. ............. | 438/618 |
| 6,121,659 A * | 9/2000 | Christensen et al. ...... | 257/347 |
| 6,191,451 B1 * | 2/2001 | Nowak et al. ............ | 257/347 |
| 6,288,424 B1 * | 9/2001 | Ludikhuize ............... | 257/335 |
| 6,303,954 B1 * | 10/2001 | Ohoka .................... | 257/296 |
| 6,492,244 B1 | 12/2002 | Christensen et al. | |
| 6,534,831 B2 * | 3/2003 | Kato ...................... | 257/347 |
| 6,914,308 B2 * | 7/2005 | Fujii ..................... | 257/378 |

FOREIGN PATENT DOCUMENTS

| | | |
|---|---|---|
| JP | 10-12825 A | 1/1998 |
| JP | 2001-44277 A | 2/2001 |
| JP | 2001-339071 A | 12/2001 |
| JP | 2002-124636 A | 4/2002 |

* cited by examiner

Primary Examiner—Sara Crane
Assistant Examiner—Samuel A. Gebremariam
(74) Attorney, Agent, or Firm—Sughrue Mion, PLLC

(57) ABSTRACT

A semiconductor IC device includes a base substrate comprising $P^-$-type silicon, a first $P^+$-type silicon layer is provided on the base substrate, and an $N^+$-type silicon layer and a second $P^+$-type silicon layer are provided in the same layer thereon. The impurity concentration of the first $P^+$-type silicon layer and the $N^+$-type silicon layer is higher than that of the base substrate. Also, a buried oxide layer and an SOI layer are provided on the entire upper surface of the $N^+$-type silicon layer and the second $P^+$-type silicon layer. The first $P^+$-type silicon layer is connected to ground potential wiring GND, and the $N^+$-type silicon layer is connected to power-supply potential wiring VDD. Accordingly, a decoupling capacitor, which is connected in parallel to the power supply, is formed between the $P^+$-type silicon layer and the $N^+$-type silicon layer.

23 Claims, 18 Drawing Sheets

SOI SUBSTRATE AND SEMICONDUCTOR INTEGRATED CIRCUIT DEVICE

BACKGROUND OF THE INVENTION

1. Field of the Invention

The present invention relates to a silicon-on-insulator (SOI) substrate and a semiconductor integrated circuit (IC) device with reduced noise. In particular, the present invention relates to an SOI substrate and an SOI IC device for realizing larger packing density of elements.

2. Description of the Related Art

In a hitherto developed SOI technology, a buried oxide (BOX) layer is formed on a silicon substrate, an SOI layer is formed on the BOX layer, and an IC including a MOS transistor or the like is formed in the SOI layer. With this technology, a MOS transistor can be driven at high speed (for example, Patent Document 1: Japanese Unexamined Patent Application Publication No. 2001-339071).

Recently, however, an operating frequency of semiconductor IC devices has been extremely high and a greater area has been allocated for power-supply wiring and ground wiring. When a semiconductor IC device is operated at high frequency, fluctuations in power-supply voltage including a temporary current spike are likely to occur. Also, noise may propagate from a circuit to another in an IC including a plurality of circuits, so that a malfunction may occur in the IC.

In order to suppress fluctuations in power-supply voltage, a technology of connecting a decoupling capacitor to a power supply in parallel has been used. With this technology, power noise can be reduced and fluctuations in power-supply voltage can be suppressed, and thus a malfunction of a semiconductor IC caused by power noise and fluctuations in power-supply voltage can be prevented. In order to achieve the purpose, the capacitance of a decoupling capacitor connected to the power supply must be several tens of nF to each chip or package. In a known semiconductor IC device, a dedicated area for placing a decoupling capacitor is provided in each side between a core portion, which is an element formation area, and an I/O portion, and a decoupling capacitor is formed by using metal oxide semiconductor (MOS).

In this known semiconductor IC device, however, a dedicated area for a decoupling capacitor must be provided, and thus the area of the device increases. Accordingly, the packing density of elements decreases disadvantageously.

In order to overcome this problem, another technology has been disclosed. That is, a polycrystalline silicon layer is formed at a side of an element on a semiconductor substrate in an element formation area, and a decoupling capacitor is formed between the polycrystalline silicon layer and a diffusion layer formed on the surface of the semiconductor substrate (for example, Patent Document 2: Japanese Unexamined Patent Application Publication No. 10-12825 (P.3 and FIGS. 1 and 2)). Patent Document 2 describes that a dedicated area for a decoupling capacitor is unnecessary in this configuration.

In this known art, however, the decoupling capacitor is formed at a side of the element in the element formation area, and thus the element formation area increases disadvantageously.

Also, a technology of providing a multilayer wiring structure on a semiconductor element and forming an electrode, a dielectric layer, and an electrode thereon in this order so as to form a decoupling capacitor, has been disclosed (for example, Patent Document 3: Japanese Unexamined Patent Application Publication No. 2002-124636 (PP.3-5 and FIG. 7)). Patent Document 3 describes that a large-capacitance decoupling capacitor can be provided in the semiconductor device.

On the other hand, a technology of providing a guard ring for encircling a circuit susceptible to noise has been known (for example, Patent Document 4: Japanese Unexamined Patent Application Publication No. 2001-044277). This technology is used for preventing noise from propagating from a circuit to another.

In the technology described in Patent Document 3, however, since the decoupling capacitor is provided on the multilayer wiring structure, a pad electrode or the like cannot be provided in the area provided with the decoupling capacitor on the multilayer wiring structure. Therefore, layout freedom in the semiconductor IC device is restricted and thus the size of the device increases. Furthermore, in order to provide the decoupling capacitor on the multilayer wiring structure, at least a step of forming a lower-layer electrode, a step of forming a dielectric layer, and a step of forming an upper-layer electrode are necessary. As a result, a process of fabricating semiconductor IC devices becomes complicated and the fabrication cost increases.

Also, in the technology of providing a guard ring described in Patent Document 4, by providing a guard ring so as to encircle a circuit, the element formation area increases disadvantageously.

SUMMARY OF THE INVENTION

Accordingly, it is an object of the present invention to provide an SOI substrate and a semiconductor IC device which do not require a dedicated area for providing a structure for reducing noise, such as a decoupling capacitor and a guard ring.

An SOI substrate according to the present invention includes a base substrate; a first semiconductor region which is disposed in a part of the base substrate and which has a lower resistivity than that of the base substrate; an insulating film disposed on the base substrate; and a semiconductor layer disposed on the insulating film so as to form a semiconductor integrated circuit.

In the present invention, when a semiconductor IC device is fabricated by using the SOI substrate according to the present invention, the semiconductor region may be connected to an external power-supply so as to apply a power supply potential thereto. Accordingly, noise can be absorbed by the semiconductor region. As a result, the IC disposed in the semiconductor layer can be protected against noise, and noise generated by the IC can be prevented from propagating to another IC. Also, a dedicated area for providing the semiconductor region is unnecessary, and thus the device can be miniaturized.

A semiconductor IC device according to the present invention includes a base substrate; a first semiconductor region which is disposed in a part of the base substrate and which has a lower resistivity than that of the supporting substrate, a first potential being applied to the first semiconductor region; an insulating film disposed on the base substrate; a semiconductor layer disposed on the insulating film; and an integrated circuit disposed in the semiconductor layer.

In the present invention, the semiconductor region absorbs noise and prevents a malfunction of the IC, and effects of noise generated by the IC on another IC can be prevented. Further, a dedicated area for providing the semiconductor region is unnecessary, and thus the device can be miniaturized.

The base substrate may comprise a first conductive semiconductor and the first semiconductor region may comprise a first conductive semiconductor having a higher impurity concentration than that of the base substrate. Also, the semiconductor IC device may further include a guard ring which comprises a conductive material and which is disposed in the semiconductor layer so as to encircle the integrated circuit and to be connected to the first semiconductor region. With this configuration, noise can be absorbed more effectively.

The base substrate may comprise a first conductive semiconductor and a second potential may be applied to the base substrate, the first semiconductor region may comprise a second conductive semiconductor, and a decoupling capacitor may be formed between the base substrate and the first semiconductor region. The decoupling capacitor is formed by a PN junction at the interface between the base substrate and the first semiconductor region. With this configuration, power noise can be absorbed and the IC can be stably operated.

The semiconductor IC device may further include a first via which extends through the semiconductor layer and the insulating film and which is connected to the first semiconductor region, and the first potential may be applied to the first semiconductor region through the first via. Also, the semiconductor IC device may further include a first conductive contact region disposed in the same layer as the first semiconductor region; and a second via which extends through the semiconductor layer and the insulating film and which is connected to the contact region. The second potential may applied to the base substrate through the contact region and the second via. Alternatively, the second potential may be applied to the base substrate through the back surface thereof.

Further, the semiconductor IC device may further include a second semiconductor region which is disposed in the base substrate and which comprises a different type of semiconductor from the semiconductor in the first semiconductor region, a second potential being applied to the second semiconductor region. A decoupling capacitor may be formed between the first and second semiconductor regions. The decoupling capacitor is formed by a PN junction at the interface between the first and second semiconductor regions. With this configuration, power noise can be absorbed and the IC can be stably operated.

The second semiconductor region may be disposed on the entire upper surface of the base substrate, and the first semiconductor region may be disposed on the entire upper surface of the second semiconductor region. Alternatively, the first and second semiconductor regions may be disposed in the same layer on the upper surface of the base substrate. Preferably, when the first and second semiconductor regions are disposed in the same layer, each of the first and second semiconductor regions includes a plurality of branches which are arranged in parallel with each other and which are connected to a root portion so as to form a comb-shape when viewed from the upper surface of the base substrate, and the branches of the first and second semiconductor regions are engaged with each other, so that the first and second semiconductor regions are in contact with each other. With this configuration, the area of the interface between the first and second semiconductor regions increases and the capacitance of the decoupling capacitor can be increased.

The first and second semiconductor regions may be layers formed by epitaxial growth. In that case, the semiconductor regions having a high crystalline uniformity and a reduced crystal defect can be obtained, and thus leakage current can be reduced.

Alternatively, the first and second semiconductor regions may be formed by doping an impurity into the base substrate. In this way, each of the regions may be formed in an arbitrary shape so as to have an arbitrary area.

According to the present invention, by using an SOI substrate including a base substrate, a semiconductor region having a lower resistivity than that of the base substrate being disposed in a part of the base substrate, a miniaturized semiconductor IC device which can absorb noise can be fabricated. Accordingly, the semiconductor IC device can be stably operated.

DETAILED DESCRIPTION OF THE PREFERRED EMBODIMENTS

Figure 1:
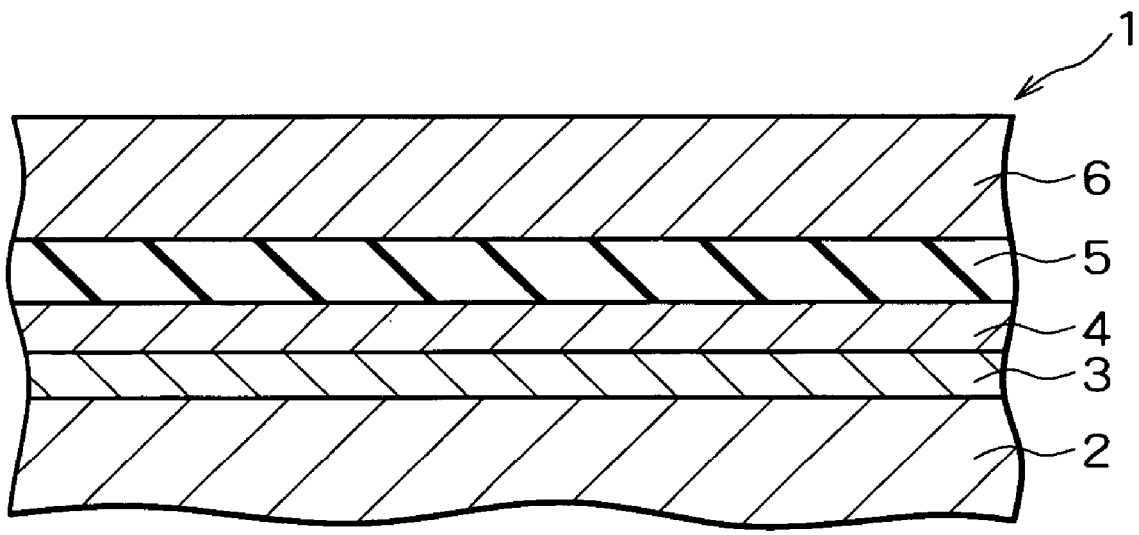
FIG. 1 is a cross-sectional view showing an SOI substrate according to a first embodiment of the present invention.
Figure 2A:
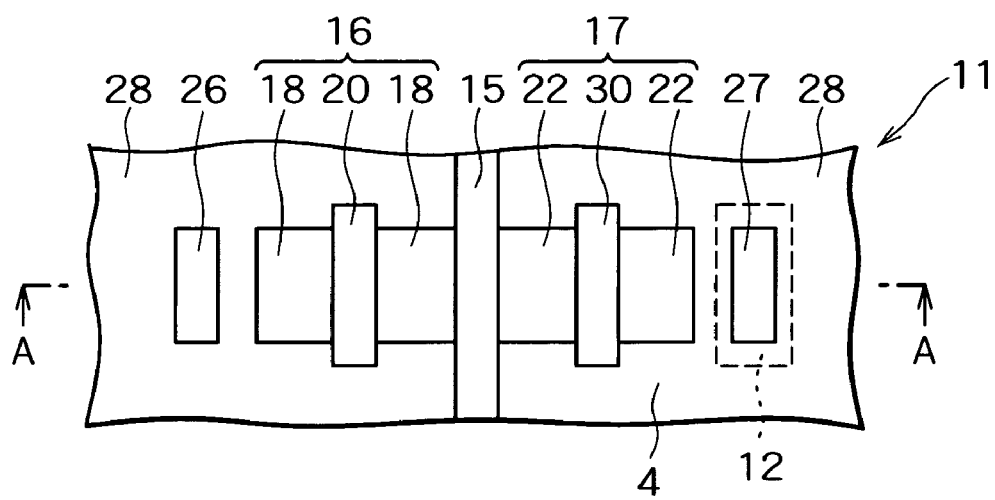
FIG. 2A is a plan view showing a semiconductor IC device according to the first embodiment.
Figure 2B:
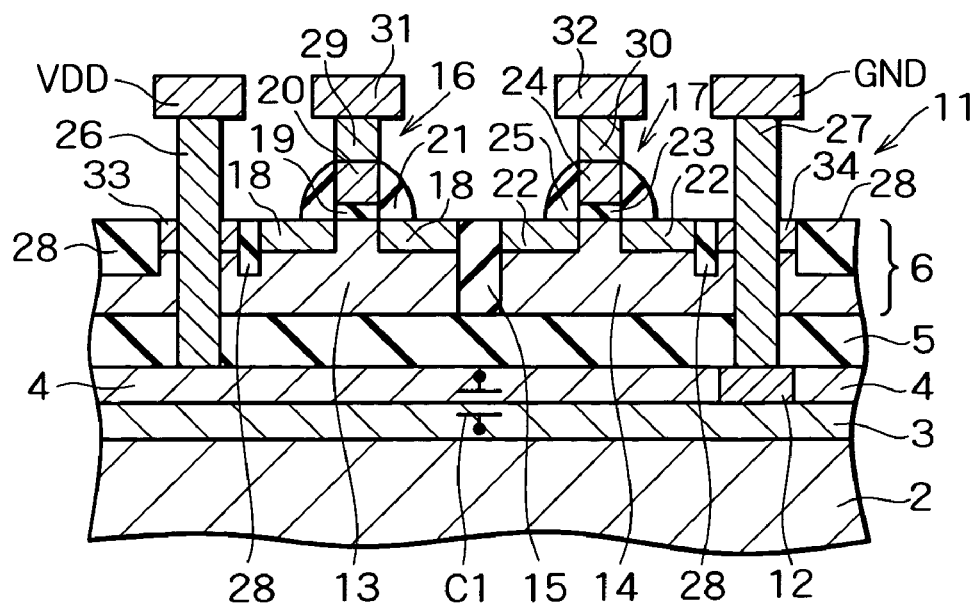
FIG. 2B is a cross-sectional view taken along the line A-A in FIG. 2A.

Hereinafter, embodiments of the present invention will be described with reference to the drawings. First, a first embodiment will be described. FIG. 1 is a cross-sectional view showing an SOI substrate 1 according to this embodiment; FIG. 2A is a plan view showing a semiconductor integrated circuit (IC) device 11 according to this embodiment; and FIG. 2B is a cross-sectional view taken along the line A-A in FIG. 2A. In FIG. 2A, side walls 21 and 25, vias 29 and 30, wiring lines 31 and 32, power-supply potential wiring VDD, and ground potential wiring GND, which will be described later, are not shown.

As shown in FIG. 1, the SOI substrate 1 of this embodiment includes a base substrate 2 comprising P$^-$-type silicon, a P$^+$-type silicon layer 3 is disposed on the entire upper surface of the base substrate 2, and an N$^+$-type silicon layer 4 is disposed on the entire upper surface of the P$^+$-type silicon layer 3. Further, a buried oxide (BOX) layer 5 is disposed on the entire upper surface of the N$^+$-type silicon layer 4, and an SOI layer 6 is disposed on the entire upper surface of the BOX layer 5.

The thickness of the entire SOI substrate 1 is, for example, 300 to 800 μm, in which the P$^+$-type silicon layer 3 is 50 to 300 nm thick, the N$^+$-type silicon layer 4 is 50 to 300 nm thick, the BOX layer 5 is 150 nm thick, and the SOI layer 6 is 250 nm thick. Further, a P-type impurity such as boron (B) is doped into the base substrate 2 and the P$^+$-type silicon layer 3. The impurity concentration of the base substrate 2 is $1 \times 10^{15}$ cm$^{-3}$, and the impurity concentration of the P$^+$-type silicon layer 3 is $1 \times 10^{17}$ cm$^{-3}$, which is higher than that of the base substrate 2. Further, an N-type impurity such as phosphorus (P) is doped into the N$^+$-type silicon layer 4, the impurity concentration thereof being $1 \times 10^{17}$ cm$^{-3}$.

As shown in FIGS. 2A and 2B, the semiconductor IC device 11 of this embodiment is fabricated by processing the SOI substrate 1 shown in FIG. 1. The semiconductor IC device 11 includes the base substrate 2, the P$^+$-type silicon layer 3 is disposed on the entire upper surface of the base substrate 2, and the N$^+$-type silicon layer 4 and a P$^+$-type silicon layer 12 are disposed in the same layer on the P$^+$-type silicon layer 3. That is, the N$^+$-type silicon layer 4 is disposed in part of the upper surface of the P$^+$-type silicon layer 3, and the P$^+$-type silicon layer 12 is disposed in the other area. Further, the BOX layer 5 and the SOI layer 6 are disposed on the entire upper surface of the N$^+$-type silicon layer 4 and the P$^+$-type silicon layer 12.

An N well 13 and a P well 14 are disposed in the SOI layer 6, and an element separating film 15 is disposed between the N well 13 and the P well 14. The lower end of the element separating film 15 is in contact with the upper surface of the BOX layer 5. As a result, the N well 13 and the P well 14 are insulated from each other by the element separating film 15. A PMOS transistor 16 and an n-type diffusion region 33 are disposed in the N well 13, and an NMOS transistor 17 and a p-type diffusion region 34 are disposed in the P well 14.

Two p-type diffusion regions 18 serving as a source and drain are disposed on the surface of the N well 13, and a region between the p-type diffusion regions 18 in the N well 13 serves as a channel region. A gate insulating film 19 is disposed in the channel region, and a gate electrode 20 comprising polysilicon or the like is disposed on the gate insulating film 19. Also, side walls 21 comprising silicon oxide films or the like are disposed at the sides of the gate insulating film 19 and the gate electrode 20. The N well 13, the p-type diffusion regions 18, the gate insulating film 19, the gate electrode 20, and the side walls 21 form the PMOS transistor 16.

Likewise, two n-type diffusion regions 22 serving as a source and drain are disposed on the surface of the P well 14, and a region between the n-type diffusion regions 22 in the P well 14 serves as a channel region. A gate insulating film 23 and a gate electrode 24 are disposed in the channel region, and side walls 25 are disposed at the sides of the gate insulating film 23 and the gate electrode 24. The P well 14, the n-type diffusion regions 22, the gate insulating film 23, the gate electrode 24, and the side walls 25 form the NMOS transistor 17. The PMOS transistor 16 and the NMOS transistor 17 serve as part of the IC of the semiconductor IC device 11.

Further, an n-type diffusion region 33 is disposed on the upper surface of the N well 13, such that the n-type diffusion region 33 is separated from the p-type diffusion region 18 by an STI region 28. A via 26 extends through the n-type diffusion region 33, the N well 13, and the BOX layer 5. The lower end of the via 26 is connected to the N$^+$-type silicon layer 4, the upper end thereof is connected to the power-supply potential wiring VDD, and the portion between the upper and lower ends is connected to the N well 13 through the n-type diffusion region 33. Likewise, a p-type diffusion region 34 is disposed on the upper surface of the P well 14, such that the p-type diffusion region 34 is separated from the n-type diffusion region 22 by an STI region 28. A via 27 extends through the p-type diffusion region 34, the P well 14, and the BOX layer 5. The lower end of the via 27 is connected to the P$^+$-type silicon layer 12, the upper end thereof is connected to the ground potential wiring GND, and the portion between the upper and lower ends is connected to the P well 14 through the p-type diffusion region 34. In the upper surface of the SOI layer 6, the STI region 28 is disposed in the area which is not provided with the element separating film 15, the PMOS transistor 16, the NMOS transistor 17, the vias 26 and 27, the n-type diffusion region 33, and the p-type diffusion region 34. The STI region 28 is a partial separating film, the lower end thereof not being in contact with the BOX layer 5. The gate electrodes 20 and 24 are connected to the wiring lines 31 and 32 through vias 29 and 30, respectively. Tungsten (W) or doped polysilicon is embedded in the vias 26, 27, 29, and 30.

With this configuration, a power-supply potential is applied to the N$^+$-type silicon layer 4 through the power-supply potential wiring VDD and the via 26, and a ground potential is applied to the P$^+$-type silicon layers 3 and 12 through the ground potential wiring GND and the via 27. As a result, a decoupling capacitor C1 is formed between the N$^+$-type silicon layer 4 and the P$^+$-type silicon layers 3 and 12.

Next, the operation of the semiconductor IC device 11 of this embodiment will be described. When the PMOS transistor 16 is driven, a depletion layer is generated in a region just under the p-type diffusion regions 18 serving as the source and drain in the N well 13, and the depletion layer reaches the BOX layer 5. As a result, a parasitic capacitance in the PMOS transistor 16 is reduced, and a neutral region (body), which is electrically floating, is generated just under the channel region of the N well 13. At this time, by applying a power-supply potential to the power-supply potential wiring VDD, the power-supply potential is applied to the neutral region through the via 26 and the potential in the neutral region is weakly fixed. Accordingly, the PMOS transistor 16 can be driven at high speed. Likewise, the NMOS transistor 17 can be driven at high speed.

Also, by applying a power-supply potential to the power-supply potential wiring VDD, the power-supply potential is applied to the $N^+$-type silicon layer 4 through the via 26. On the other hand, by applying a ground potential to the ground potential wiring GND, the ground potential is applied to the $P^+$-type silicon layers 12 and 3 through the via 27. As a result, a reverse-biased PN junction is formed between the $N^+$-type silicon layer 4 and the $P^+$-type silicon layers 12 and 3. Accordingly, the decoupling capacitor C1, which is connected in parallel to the power supply, is formed in the semiconductor IC device 11.

In this way, in the first embodiment, the decoupling capacitor C1, which is connected in parallel to the power supply, is formed under the BOX layer 5. With this arrangement, a dedicated area for providing the decoupling capacitor is not required, and power noise can be reduced. Accordingly, malfunction of the IC caused by power noise can be prevented and the semiconductor IC device 11 can be miniaturized.

Also, in this embodiment, a decoupling capacitor is not provided above the IC, and thus layout freedom of the IC is not restricted. Accordingly, the semiconductor IC device 11 can be further miniaturized.

Further, in this embodiment, a power-supply potential applied to the power-supply potential wiring VDD may be different from that for driving the PMOS transistor 16 and the NMOS transistor 17. Accordingly, for example, by setting the driving voltage of the transistors to 1 V and by setting the power-supply potential which is applied to the power-supply potential wiring VDD so as to form the decoupling capacitor C1 between the ground potential and the power-supply potential to 2 V, the transistors can be driven at high speed and the capacitance of the decoupling capacitor C1 can be increased.

Still further, in this embodiment, since the IC is provided on the SOI substrate, the IC can be driven at high speed.

In this embodiment, the base substrate 2 comprises P-type silicon. Alternatively, the base substrate 2 may comprise an insulating material such as glass or an intrinsic semiconductor or the like. Accordingly, propagation of noise through the base substrate 2 can be prevented.

In the SOI substrate 1 and the semiconductor IC device 11 of this embodiment, the $N^+$-type silicon layer 4 is disposed on the $P^+$-type silicon layer 3. Alternatively, the $P^+$-type silicon layer may be disposed on the $N^+$-type silicon layer. In that case, an $N^+$-type silicon layer is locally formed in the upper $P^+$-type silicon layer, so that a power-supply potential is applied to the lower $N^+$-type silicon layer through the locally-formed $N^+$-type silicon layer. Also, a ground potential is applied to the $P^+$-type silicon layer.

Further, in this embodiment, the via 26 extends through the N well 13 and the via 27 extends through the P well 14. Alternatively, a via may extend through the element separating film 15. In this way, the first embodiment can also be applied to ICs other than the IC disclosed in Patent Document 1, that is, ICs including a contact for fixing a potential in the neutral region of a MOS transistor.

Still further, in order to increase the area of the interface between the $N^+$-type silicon layer 4 and the $P^+$-type silicon layers 3 and 12, the $N^+$-type silicon layer 4 and the $P^+$-type silicon layer 12 may be processed into other shapes. For example, the $N^+$-type silicon layer 4 may be formed in a grid pattern and the $P^+$-type silicon layer 12 may be arranged in a matrix pattern, when viewed from the vertical direction relative to the upper surface of the base substrate 2. The $P^+$-type silicon layer 3 is provided evenly on the entire surface. Accordingly, the area of the PN junction can be increased and also the capacitance of the decoupling capacitor can be increased.

Still further, in this embodiment, boron (B) is used as a P-type impurity. Alternatively, indium (In) may be used. Also, phosphorus (P) is used as an N-type impurity in this embodiment, but arsenic (As) or antimony (Sb) may be used instead. This is the same in the following embodiments.

Figure 3:
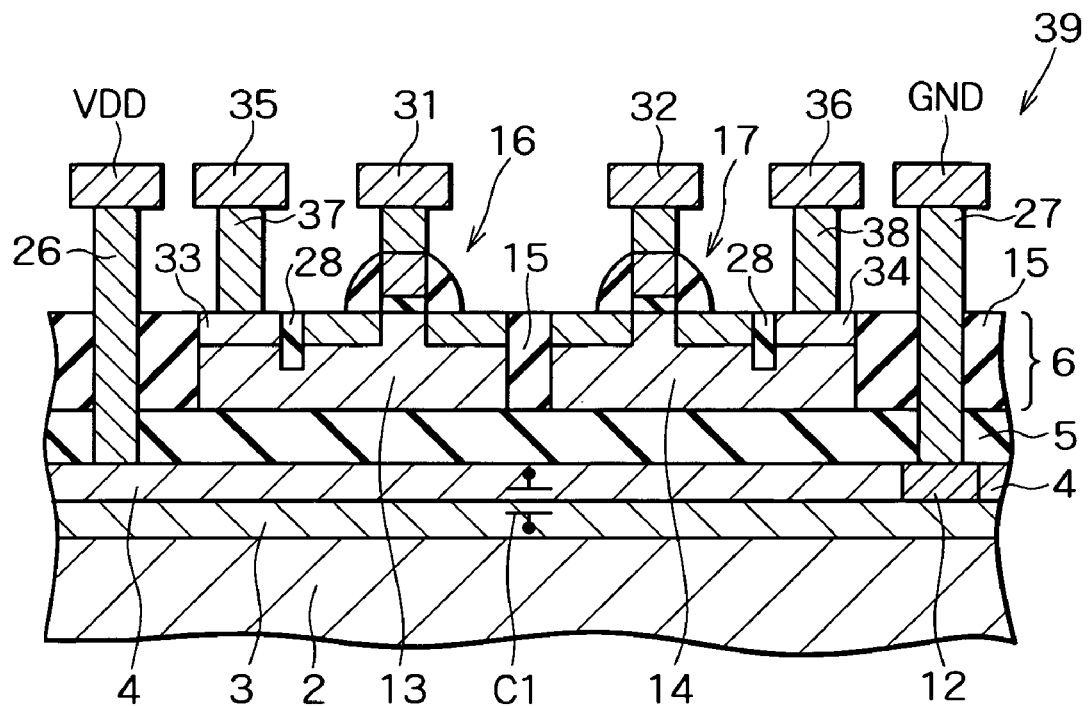
FIG. 3 is a cross-sectional view showing a semiconductor IC device according to a variation of the first embodiment.

Next, a variation of the first embodiment will be described. FIG. 3 is a cross-sectional view showing a semiconductor IC device 39 according to this variation. As shown in FIG. 3, in the semiconductor IC device 39, the via 26 extends through the element separating film 15 and the BOX layer 5 so as to be connected to the $N^+$-type silicon layer 4. Also, the via 27 extends through the element separating film 15 and the BOX layer 5 so as to be connected to the $P^+$-type silicon layer 12. With this configuration, the vias 26 and 27 are not connected to the N well 13 and the P well 14, respectively.

On the other hand, a via 37 is connected to the N well 13 through the n-type diffusion region 33. The upper end of the via 37 is connected to a wiring line 35, and the lower end thereof is connected to the n-type diffusion region 33. Also, a via 38 is connected to the P well 14 through the p-type diffusion region 34. The upper end of the via 38 is connected to a wiring line 36, and the lower end thereof is connected to the p-type diffusion region 34. Other than that, the configuration of the semiconductor IC device 39 is the same as that of the semiconductor IC device 11 according to the first embodiment.

In this variation, by applying a predetermined potential to the wiring line 35, the potential of the neutral region (body) of the PMOS transistor 16 can be fixed through the via 37. Also, by applying a predetermined potential to the wiring line 36, the potential of the neutral region of the NMOS transistor 17 can be fixed through the via 38. On the other hand, the capacitance of the decoupling capacitor C1 is controlled by a voltage applied to the power-supply potential wiring VDD the ground potential wiring GND. Therefore, the potential for forming the decoupling capacitor C1 may be different from the potential for fixing the neutral region of each transistor, and thus the capacitance of the decoupling capacitor C1 can be determined independently from driving conditions of the transistors.

Figure 4:
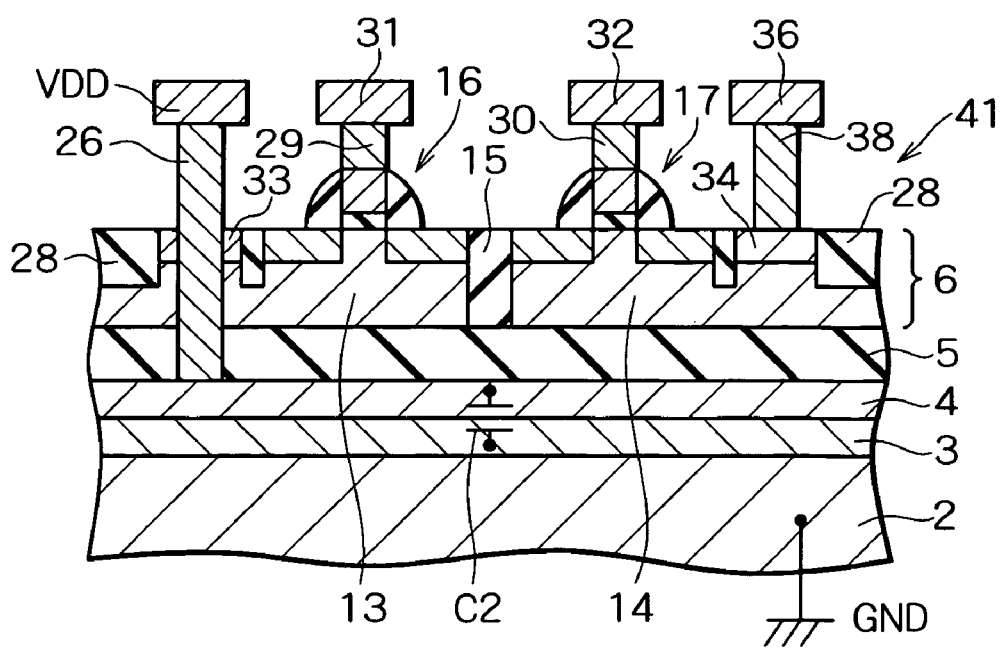
FIG. 4 is a cross-sectional view showing a semiconductor IC device according to a second embodiment of the present invention.

Next, a second embodiment of the present invention will be described. FIG. 4 is a cross-sectional view showing a semiconductor IC device 41 according to this embodiment. As shown in FIG. 4, the semiconductor IC device 41 is fabricated by processing the SOI substrate 1 (see FIG. 1) of the first embodiment. The semiconductor IC device 41 is different from the semiconductor IC device 11 (see FIGS. 2A and 2B) of the first embodiment in that the $P^+$-type silicon layer 3 is connected to the ground potential wiring GND through the back surface of the base substrate 2, that is, the surface which is not provided with the $P^+$-type silicon layer 3. Therefore, the via 27 and the P$^+$-type silicon layer 12 shown in FIG. 2B are not disposed in the semiconductor IC device 41, and the N$^+$-type silicon layer 4 is disposed on the entire upper surface of the P$^+$-type silicon layer 3. The base substrate 2 comprises P$^-$-type silicon. Further, the via 38 is connected to the P well 14 through the p-type diffusion region 34. The upper end of the via 38 is connected to the wiring line 36 and the lower end thereof is connected to the p-type diffusion region 34. With this configuration, a reverse-biased PN junction is formed between the P$^+$-type silicon layer 3 and the N$^+$-type silicon layers 4, and a decoupling capacitor C2, which is connected in parallel to the power supply, is formed. Other than that, the configuration and the operation of this embodiment are the same as those in the first embodiment.

In the second embodiment, the decoupling capacitor C2, which is connected in parallel to the power supply, can be formed between the P$^+$-type silicon layer 3 and the N$^+$-type silicon layers 4. Accordingly, the semiconductor IC device 41 can be miniaturized and power noise can be suppressed. Also, since the P$^+$-type silicon layer 12 is not necessary, the fabricating process is simpler than that in the first embodiment. Further, since the via 27 is not necessary, the semiconductor IC device 41 can be further miniaturized. Other than that, the advantages of this embodiment are the same as those in the first embodiment.

Figure 5:
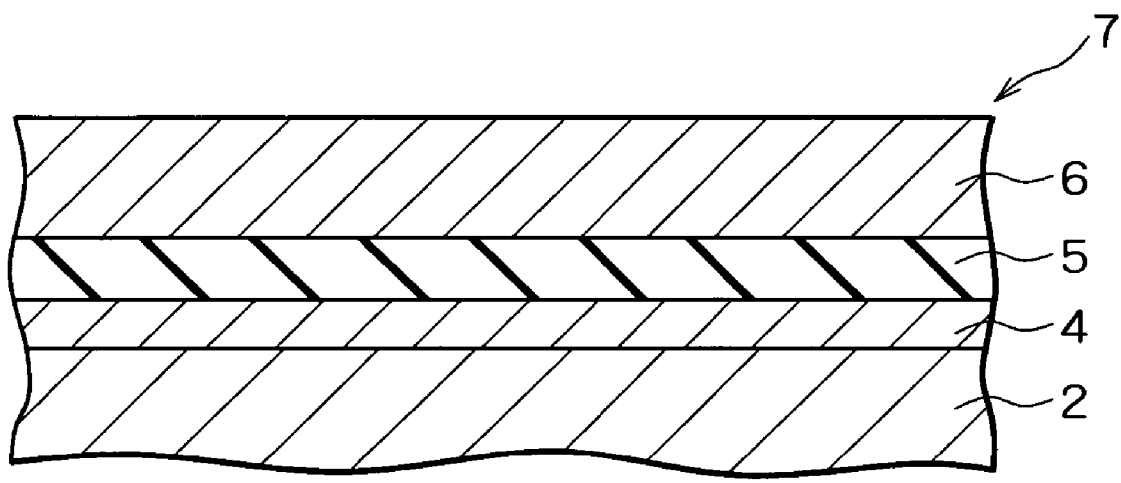
FIG. 5 is a cross-sectional view showing an SOI substrate according to a third embodiment of the present invention.
Figure 6A:
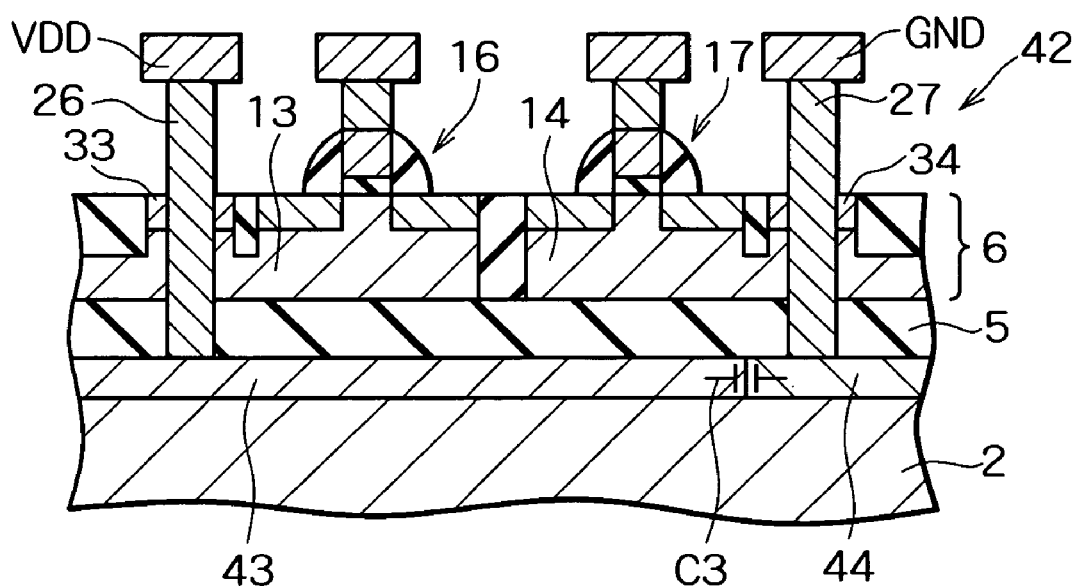
FIG. 6A is a cross-sectional view showing a semiconductor IC device according to the third embodiment.
Figure 6B:
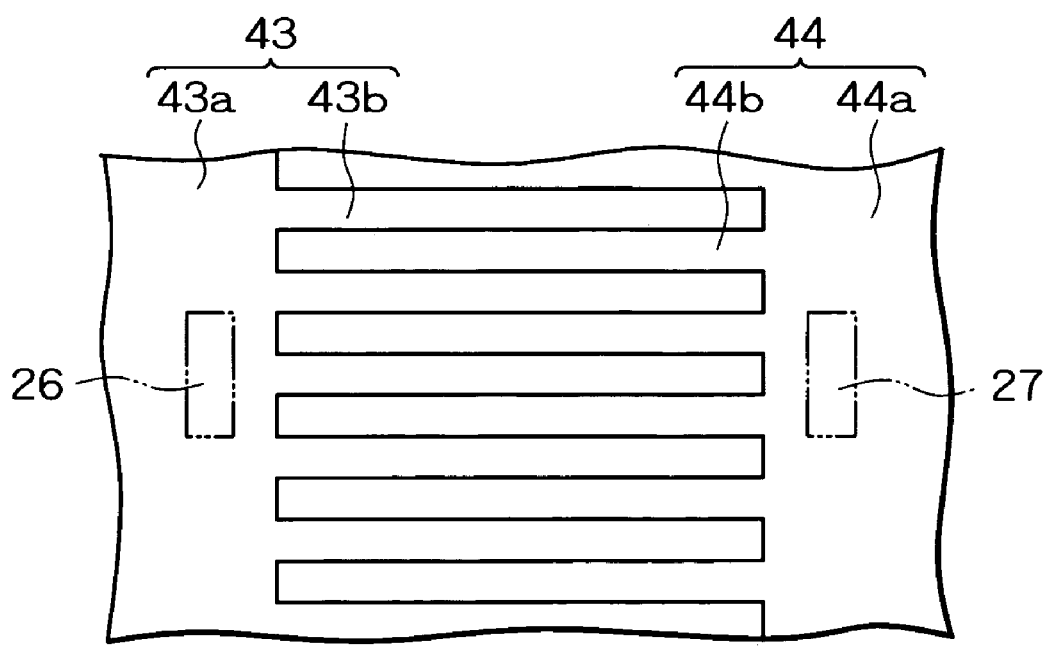
FIG. 6B is a plan view thereof.

Next, a third embodiment of the present invention will be described. FIG. 5 is a cross-sectional view showing an SOI substrate 7 according to this embodiment; FIG. 6A is a cross-sectional view showing a semiconductor IC device 42 according to this embodiment; and FIG. 6B is a plane view thereof. As shown in FIG. 5, the SOI substrate 7 according to this embodiment includes the base substrate 2 comprising P$^-$-type silicon, the N$^+$-type silicon layer 4 is disposed on the entire upper surface of the base substrate 2, the BOX layer 5 is disposed on the entire upper surface of the N$^+$-type silicon layer 4, and the SOI layer 6 is disposed on the entire upper surface of the BOX layer 5. Other than that, the configuration of the SOI substrate 7 is the same as that of the SOI substrate 1 (see FIG. 1) according to the first embodiment.

As shown in FIG. 6A, the semiconductor IC device 42 according to this embodiment is fabricated by processing the SOI substrate 7. The semiconductor IC device 42 includes the base substrate 2 comprising P$^-$-type silicon, and an N$^+$-type silicon layer 43 and a P$^+$-type silicon layer 44 are disposed in the same layer on the base substrate 2. As shown in FIG. 6B, each of the N$^+$-type silicon layer 43 and the P$^+$-type silicon layer 44 is comb-shaped, when viewed from the vertical direction relative to the upper surface of the base substrate 2. That is, the N$^+$-type silicon layer 43 includes a root portion 43$a$ and a plurality of branches 43$b$, which are arranged in parallel with each other. One end of each branch is connected to the root portion 43$a$. Likewise, the P$^+$-type silicon layer 44 includes a root portion 44$a$ and a plurality of branches 44$b$, which are arranged in parallel with each other. One end of each branch is connected to the root portion 44$a$. The branches 43$b$ of the N$^+$-type silicon layer 43 and the branches 44$b$ of the P$^+$-type silicon layer 44 are engaged with each other, so that the N$^+$-type silicon layer 43 and the P$^+$-type silicon layer 44 are in contact with each other. The N$^+$-type silicon layer 43 and the P$^+$-type silicon layer 44 cover the entire upper surface of the base substrate 2. That is, on the upper surface of the base substrate 2, the area which is not provided with the N$^+$-type silicon layer 43 is provided with the P$^+$-type silicon layer 44. FIG. 6B shows only the N$^+$-type silicon layer 43 and the P$^+$-type silicon layer 44. Further, the BOX layer 5 is disposed on the N$^+$-type silicon layer 43 and the P$^+$-type silicon layer 44, and the SOI layer 6 is disposed on the entire upper surface of the BOX layer 5. The PMOS transistor 16 and the NMOS transistor 17 are disposed in the SOI layer 6.

Further, the via 26 extends through the SOI layer 6 and the BOX layer 5, the via 26 being connected to the power-supply potential wiring VDD and the N$^+$-type silicon layer 43. Also, the via 27 extends through the SOI layer 6 and the BOX layer 5, the via 27 being connected to the ground potential wiring GND and the P$^+$-type silicon layer 44. With this configuration, a power-supply potential is applied to the N$^+$-type silicon layer 43 through the via 26, and a ground potential is applied to the P$^+$-type silicon layer 44 through the via 27. As a result, a reverse-biased PN junction is formed between the N$^+$-type silicon layer 43 and the P$^+$-type silicon layer 44, and a decoupling capacitor C3, which is connected in parallel to the power supply, is formed. Other than that, the configuration and the operation of the semiconductor IC device 42 of this embodiment are the same as those of the semiconductor IC device 11 according to the first embodiment.

Compared to the above-described SOI substrate 1, the SOI substrate 7 of this embodiment does not include the P$^+$-type silicon layer 3 (see FIG. 1), and thus the fabrication cost can be reduced. Also, since the semiconductor IC device 42 of this embodiment can be fabricated by using the SOI substrate 7, the fabrication cost can be reduced. A method for fabricating the semiconductor IC device 42 will be described later. Further, in the semiconductor IC device 42, by forming each of the N$^+$-type silicon layer 43 and the P$^+$-type silicon layer 44 in a comb-shape, the contact area between these layers can be increased, and thus the capacitance of the decoupling capacitor C3 can be increased. Accordingly, power nose can be more effectively suppressed. Other than that, the advantages of this embodiment are the same as those in the first embodiment.

In the third embodiment, each of the N$^+$-type silicon layer 43 and the P$^+$-type silicon layer 44 is comb-shaped. However, any shape may be adopted as long as a PN junction is formed between the N$^+$-type silicon layer 43 and the P$^+$-type silicon layer 44.

Further, the via 27 may be omitted, and a ground potential maybe applied to the P$^+$-type silicon layer 44 through the base substrate 2, which comprises P$^-$-type silicon. Alternatively, the base substrate 2 may comprise N$^-$-type silicon, and a power-supply potential may be applied to the N$^+$-type silicon layer 43 through the base substrate 2. In this case, the via 26 may be omitted.

Figure 7:
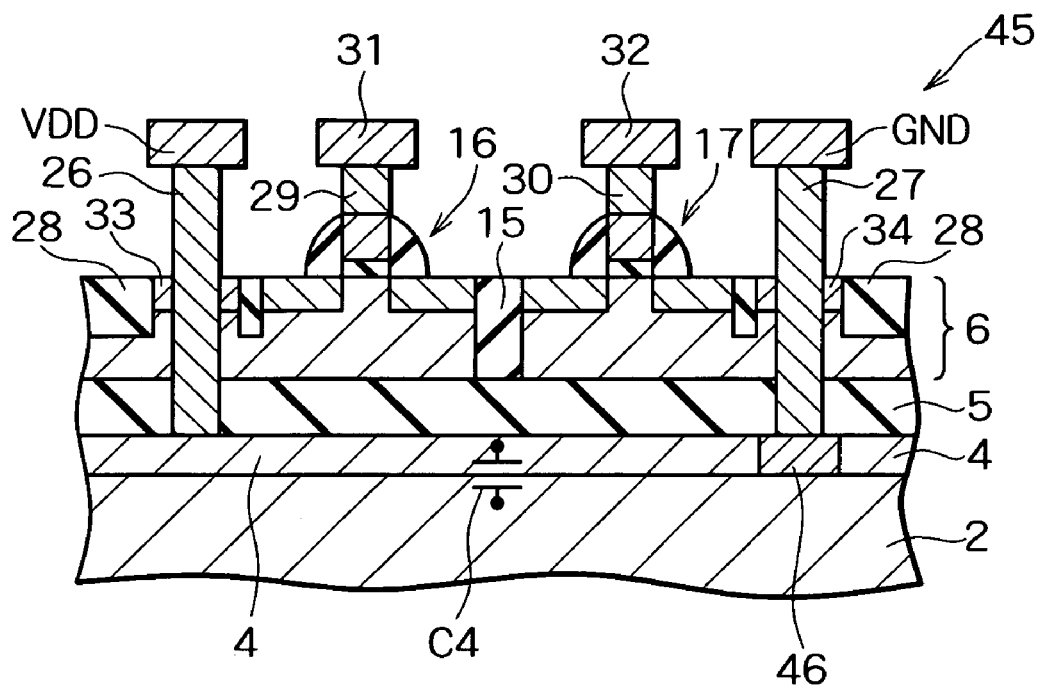
FIG. 7 is a cross-sectional view showing a semiconductor IC device according to a fourth embodiment of the present invention.

Next, a fourth embodiment of the present invention will be described. FIG. 7 is a cross-sectional view showing a semiconductor IC device 45 according to this embodiment. As shown in FIG. 7, the semiconductor IC device 45 is fabricated by processing the SOI substrate 7 of the third embodiment. Compared to the semiconductor IC device 11 (see FIGS. 2A and 2B) according to the first embodiment, the semiconductor IC device 45 does not include the P$^+$-type silicon layer 3, and the N$^+$-type silicon layer 4 and a P$^+$-type silicon layer 46 are disposed in the same layer on the base substrate 2 comprising P$^-$-type silicon. The via 26 is connected between the power-supply potential wiring VDD and the N$^+$-type silicon layer 4, and the via 27 is connected between the ground potential wiring GND and the P$^+$-type silicon layer 46. With this configuration, a power-supply potential is applied to the N$^+$-type silicon layer 4 through the power-supply potential wiring VDD and the via 26, and a ground potential is applied to the base substrate 2 through the ground potential wiring GND, the via 27, and the P+-type silicon layer 46. As a result, a reverse-biased PN junction is formed between the N+-type silicon layer 4 and the base substrate 2, so that a decoupling capacitor C4, which is connected in parallel to the power supply, is formed. Other than that, the configuration and the operation of this embodiment are the same as those in the first embodiment.

In the fourth embodiment, since the decoupling capacitor C4, which is connected in parallel to the power supply, can be formed between the N+-type silicon layer 4 and the base substrate 2, the semiconductor IC device 45 can be miniaturized and power noise can be suppressed. Also, in this embodiment, the P+-type silicon layer 3 (see FIG. 4) can be omitted unlike in the first embodiment, and thus the fabrication cost can be reduced. On the other hand, in the first embodiment, the decoupling capacitor C1 can be formed between the P+-type silicon layer 3 and the N+-type silicon layer 4, in which the impurity concentration is higher than that in the base substrate 2. Therefore, the capacitance of the decoupling capacitor can be increased more easily than in the fourth embodiment. Other than that, the advantages of this embodiment are the same as those in the first embodiment.

Figure 8:
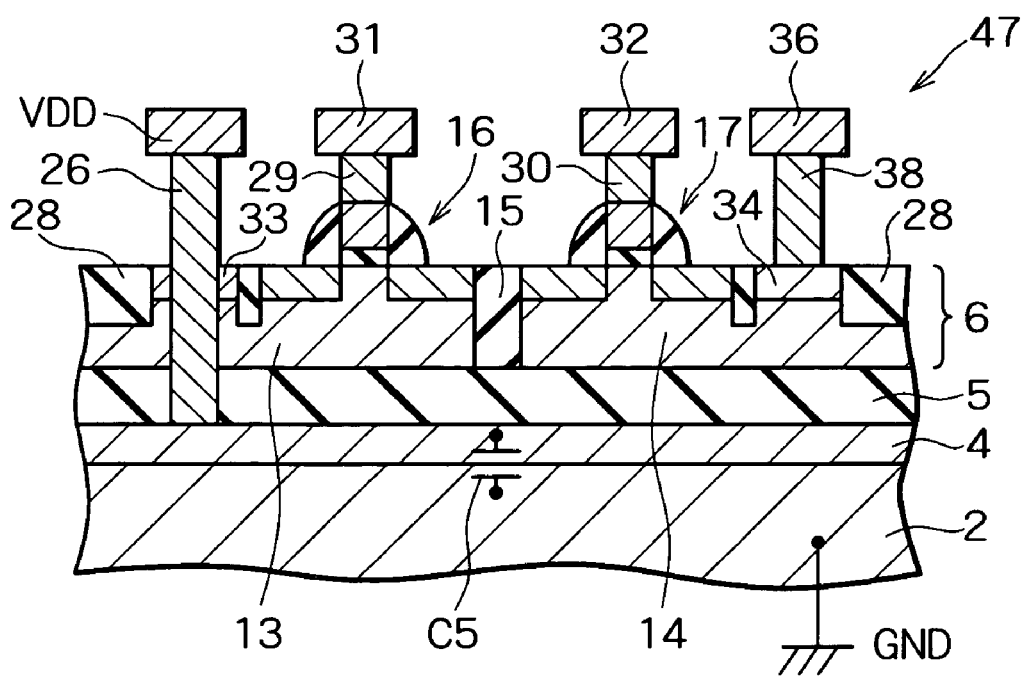
FIG. 8 is a cross-sectional view showing a semiconductor IC device according to a fifth embodiment of the present invention.

Next, a fifth embodiment of the present invention will be described. FIG. 8 is a cross-sectional view showing a semiconductor IC device 47 according to this embodiment. As shown in FIG. 8, the semiconductor IC device 47 is fabricated by processing the SOI substrate 7 of the third embodiment. Compared to the semiconductor IC device 41 (see FIG. 4) according to the second embodiment, the semiconductor IC device 47 does not include the P+-type silicon layer 3, and the N+-type silicon layer 4 is disposed on the entire upper surface of the base substrate 2, which comprises P−-type silicon. The base substrate 2 is connected to the ground potential wiring GND through the back surface thereof. With this configuration, a power-supply potential is applied to the N+-type silicon layer 4 through the power-supply potential wiring VDD and the via 26, and a ground potential is applied to the base substrate 2. As a result, a reverse-biased PN junction is formed between the N+-type silicon layer 4 and the base substrate 2, so that a decoupling capacitor C5, which is connected in parallel to the power supply, is formed. Other than that, the configuration and the operation of this embodiment are the same as those in the second embodiment.

In the fifth embodiment, since the decoupling capacitor C5, which is connected in parallel to the power supply, can be formed between the N+-type silicon layer 4 and the base substrate 2, power noise can be suppressed. Also, in this embodiment, the P+-type silicon layer 3 (see FIG. 4) can be omitted unlike in the second embodiment, and thus the fabrication cost can be reduced. On the other hand, in the second embodiment, the decoupling capacitor C2 can be formed between the P+-type silicon layer 3 and the N+-type silicon layer 4, in which the impurity concentration is higher than that in the base substrate 2. Therefore, the capacitance of the decoupling capacitor can be increased more easily than in the fifth embodiment. Other than that, the advantages of this embodiment are the same as those in the second embodiment.

Figure 9:
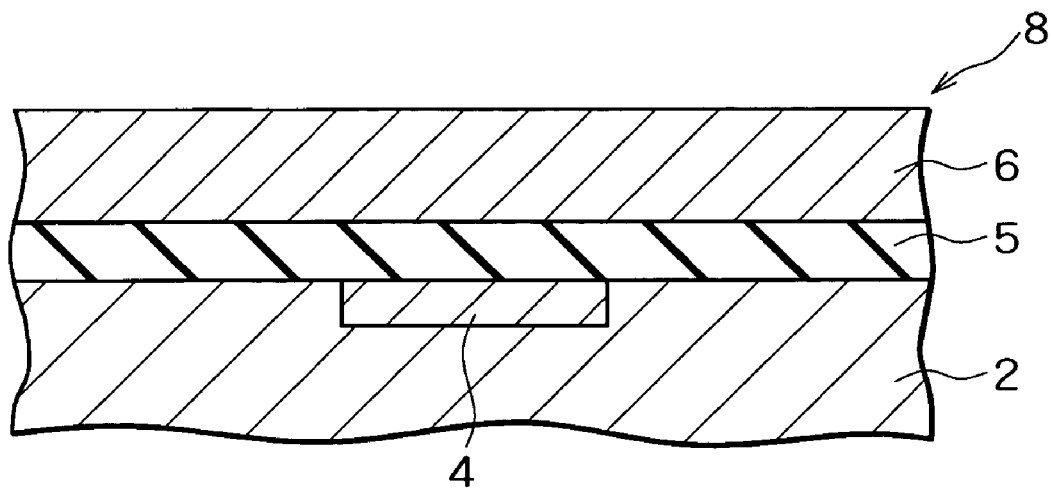
FIG. 9 is a cross-sectional view showing an SOI substrate according to a sixth embodiment of the present invention.
Figure 10:
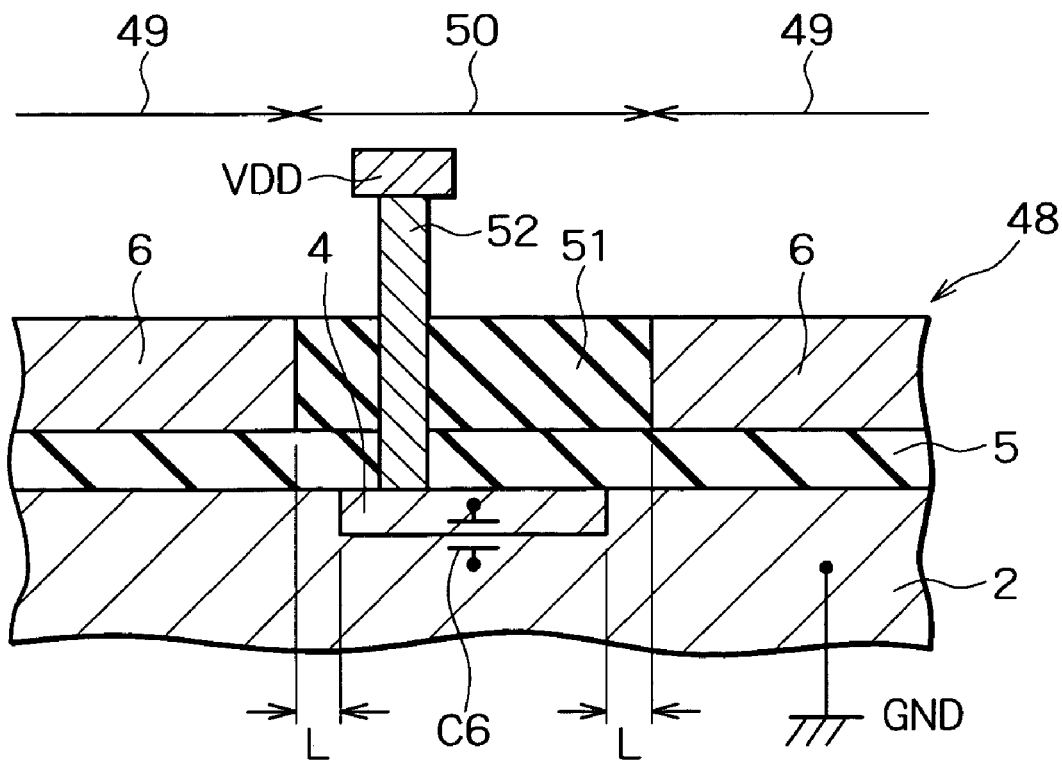
FIG. 10 is a cross-sectional view showing a semiconductor IC device according to the sixth embodiment.

Next, a sixth embodiment of the present invention will be described. FIG. 9 is a cross-sectional view showing an SOI substrate 8 according to this embodiment, and FIG. 10 is a cross-sectional view showing a semiconductor IC device 48 according to this embodiment. As shown in FIG. 9, the SOI substrate 8 of this embodiment is different from the SOI substrate 7 (see FIG. 5) of the third embodiment in that the N+-type silicon layer 4 is locally disposed in the upper surface of the base substrate 2. Other than that, the configuration of the SOI substrate 8 is the same as that of the SOI substrate 7.

As shown in FIG. 10, the semiconductor IC device 48 is fabricated by processing the SOI substrate 8. In the semiconductor IC device 48, an element formation area 49 and an element separating area 50 for dividing the element formation area 49 are set. Also, the semiconductor IC device 48 includes the base substrate 2 comprising P−-type silicon, and the N+-type silicon layer 4 is locally disposed in the upper surface of the base substrate 2 in a part of the element separating area 50. Further, the BOX layer 5 is disposed on the entire upper surface of the base substrate 2 and the N+-type silicon layer 4, and the SOI layer 6 is disposed on the BOX layer 5. Further, active elements such as an NMOS transistor and a PMOS transistor (not shown) are disposed in the SOI layer 6 in the element formation area 49. On the other hand, an element separating film 51 is disposed in the SOI layer 6 in the element separating area 50. Viewed from the vertical direction with respect to the upper surface of the base substrate 2, the N+-type silicon layer 4 is positioned within the element separating area 50 such that the outer edges of the N+-type silicon layer 4 are positioned 5 μm or more inside the outer edges of the element separating area 50. In other words, the distance L between the outer edges of the element separating area 50 and those of the N+-type silicon layer 4 is 5 μm or more.

Further, a via 52 extends through the element separating film 51 and the BOX layer 5. The upper end of the via 52 is connected to the power-supply potential wiring VDD and the lower end thereof is connected to the N+-type silicon layer 4. The base substrate 2 is connected to the ground potential wiring GND through the back surface thereof.

With this configuration, a power-supply potential is applied to the N+-type silicon layer 4 through the power-supply potential wiring VDD and the via 52, and a ground potential is applied to the base substrate 2 through the ground potential wiring GND. As a result, a reverse-biased PN junction is formed between the N+-type silicon layer 4 and the base substrate 2, so that a decoupling capacitor C6, which is connected in parallel to the power supply, is formed.

In the semiconductor IC device 48 according to the sixth embodiment, by applying a power-supply potential to the power-supply potential wiring VDD and by applying a ground potential to the ground potential wiring GND, the decoupling capacitor C6, which is connected in parallel to the power supply, is formed between the N+-type silicon layer 4 and the base substrate 2. Accordingly, the semiconductor IC device 48 can be miniaturized and power noise can be reduced.

Further, since the N+-type silicon layer 4 is not disposed just under the element formation area 49, noise does not propagate between elements through the N+-type silicon layer 4. Other than that, the advantages of this embodiment are the same as those in the fifth embodiment.

In the sixth embodiment, the base substrate 2 is connected to the ground potential wiring GND through the back surface thereof. Alternatively, a via extending through the BOX layer 5 may be disposed, so that the base substrate 2 may be connected through the via to the ground potential wiring GND, which exists above the base substrate 2. Further, in this embodiment, only the N+-type silicon layer 4 is disposed in the upper surface of the base substrate 2. Alternatively, a P+-type silicon layer may be disposed between the base substrate 2 and the N+-type silicon layer 4, so that a decoupling capacitor may be formed between the P$^+$-type silicon layer and the N$^+$-type silicon layer 4. Also, an N$^+$-type silicon layer and a P$^+$-type silicon layer may be disposed in the same layer in part of the upper surface of the base substrate 2, and a decoupling capacitor may be formed between the both layers. At this time, the N$^+$-type silicon layer and the P$^+$-type silicon layer may be comb-shaped so that the both layers are in contact with each other, as in the third embodiment. When both N$^+$-type silicon layer and P$^+$-type silicon layer are disposed, a ground potential may be applied to the P$^+$-type silicon layer through the base substrate 2 or through a via.

Figure 11:
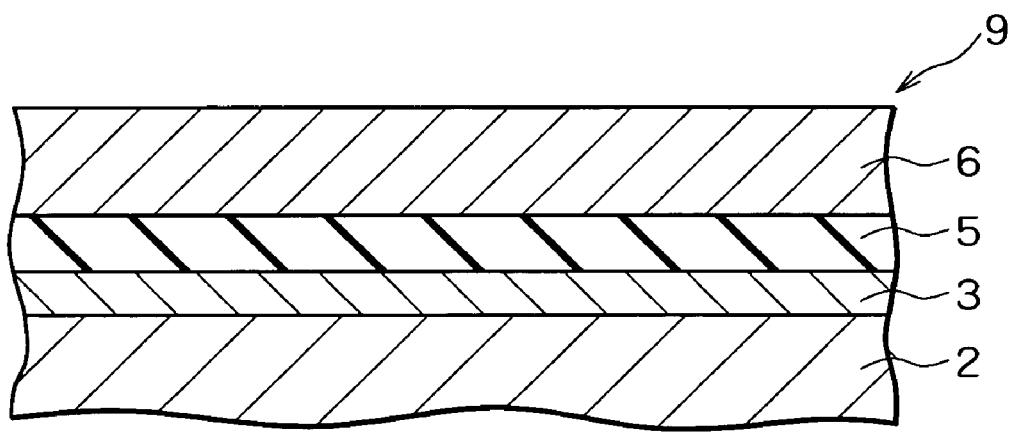
FIG. 11 is a cross-sectional view showing an SOI substrate according to a seventh embodiment of the present invention.
Figure 12:
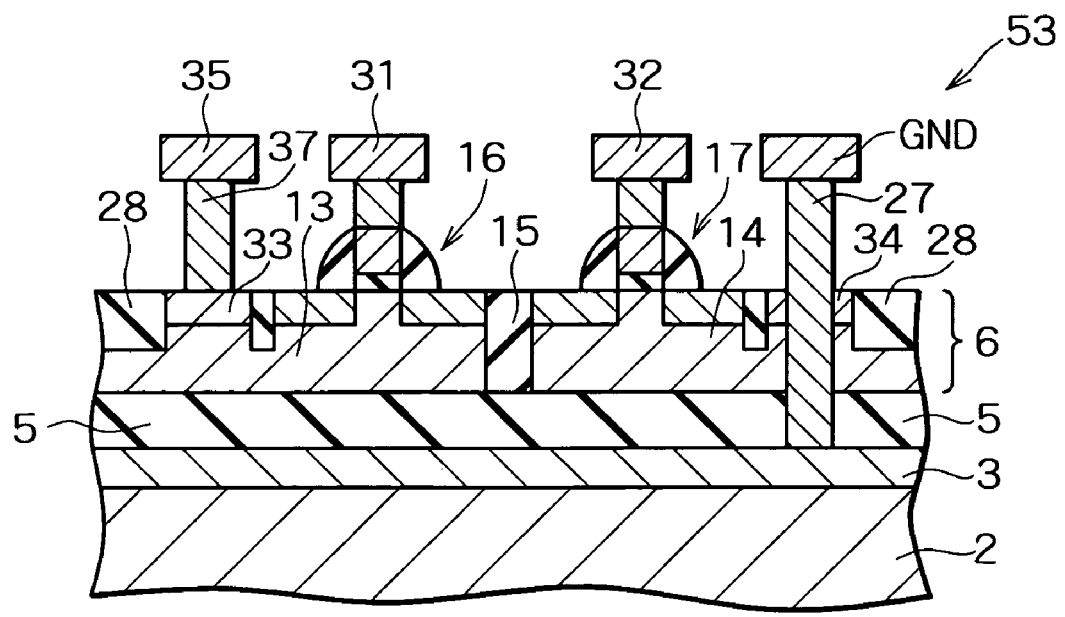
FIG. 12 is a cross-sectional view showing a semiconductor IC device according to the seventh embodiment.

Next, a seventh embodiment of the present invention will be described. FIG. 11 is a cross-sectional view showing an SOI substrate 9 according to this embodiment, and FIG. 12 is a cross-sectional view showing a semiconductor IC device 53 according to this embodiment. As shown in FIG. 11, the SOI substrate 9 includes the base substrate 2 comprising P$^-$-type silicon, the P$^+$-type silicon layer 3 is disposed on the entire upper surface of the base substrate 2, the BOX layer 5 is disposed on the entire upper surface of the P$^+$-type silicon layer 3, and the SOI layer 6 is disposed on the entire upper surface of the BOX layer 5. Other than that, the configuration of the SOI substrate 9 is the same as that of the SOI substrate 1 (see FIG. 1) according to the first embodiment.

As shown in FIG. 12, the semiconductor IC device 53 of this embodiment is fabricated by processing the SOI substrate 9. The semiconductor IC device 53 includes the base substrate 2 comprising P$^-$-type silicon, the P$^+$-type silicon layer 3 is disposed on the entire upper surface of the base substrate 2, the BOX layer 5 is disposed on the entire upper surface of the P$^+$-type silicon layer 3, and the SOI layer 6 is disposed on the entire upper surface of the BOX layer 5.

An integrated circuit including the PMOS transistor 16 and the NMOS transistor 17 is disposed in the SOI layer 6. The configuration of the PMOS transistor 16 and the NMOS transistor 17 is the same as that in the first embodiment, and the element separating film 15 is disposed in the area between the PMOS transistor 16 and the NMOS transistor 17 in the SOI layer 6. Further, the STI region 28 is disposed in the area which is not provided with the PMOS transistor 16, the NMOS transistor 17, or the element separating film 15 in the upper surface of the SOI layer 6.

Further, the via 27 extends through the p-type diffusion region 34 and the P well 14 in the SOI layer 6 and the BOX layer 5. The upper end of the via 27 is connected to the ground potential wiring GND and the lower end thereof is connected to the P$^+$-type silicon layer 3.

In the semiconductor IC device 53 of this embodiment, by applying a ground potential to the ground potential wiring GND, the ground potential is applied to the P$^+$-type silicon layer 3 through the via 27. Accordingly, the potential of the P$^+$-type silicon layer 3 is fixed to the ground potential.

In this way, in the seventh embodiment, since the potential of the P$^+$-type silicon layer 3 can be fixed to the ground potential, the P$^+$-type silicon layer 3 can absorb noise. As a result, the integrated circuit including the PMOS transistor 16 and the NMOS transistor 17 can be protected against externally applied noise. Also, noise generated from the integrated circuit can be prevented from having a bad effect on the operation of other ICs.

Since the P$^+$-type silicon layer 3 is disposed under the BOX layer 5, a dedicated area for providing the P$^+$-type silicon layer 3 is not necessary. As a result, the semiconductor IC device 53 can be miniaturized.

Further, since the IC is disposed on the SOI substrate, the IC can be driven at high speed.

In the seventh embodiment, the base substrate 2 comprises P$^-$-type silicon. Alternatively, the base substrate 2 may comprise an insulating material such as glass or an intrinsic semiconductor or the like. Accordingly, noise propagation through the base substrate 2 can be suppressed. Also, the base substrate 2 may comprise N$^-$-type silicon, and the P$^+$-type silicon layer 3 may be replaced by an N$^+$-type silicon layer.

Figure 13:
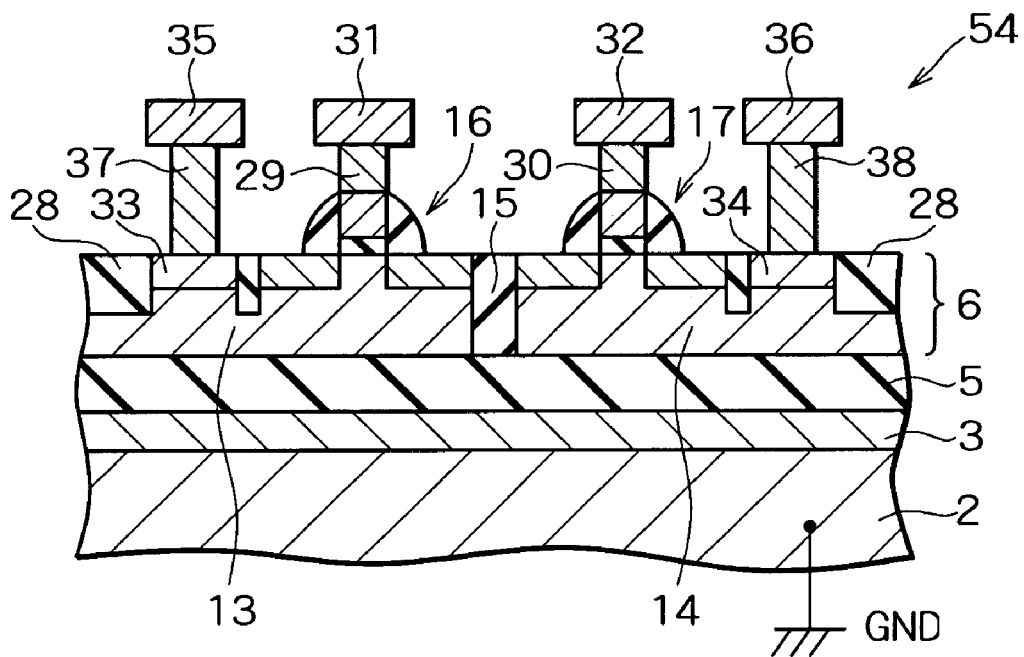
FIG. 13 is a cross-sectional view showing a semiconductor IC device according to an eighth embodiment of the present invention.

Next, an eighth embodiment of the present invention will be described. FIG. 13 is a cross-sectional view showing a semiconductor IC device 54 according to this embodiment. As shown in FIG. 13, the semiconductor IC device 54 is fabricated by processing the SOI substrate 9 (see FIG. 11). Compared with the semiconductor IC device 53 (see FIG. 12) according to the seventh embodiment, the semiconductor IC device 54 of this embodiment does not include the via 27, and the base substrate 2 comprising P$^-$-type silicon is connected to the ground potential wiring GND through the back surface thereof. Other than that, the configuration and the operation of the semiconductor IC device 54 are the same as those of the semiconductor IC device 53 according to the seventh embodiment.

In the semiconductor IC device 54 according to the eighth embodiment, by applying a ground potential to the ground potential wiring GND, the ground potential is applied to the P$^+$-type silicon layer 3 through the base substrate 2. Accordingly, the potential of the P$^+$-type silicon layer 3 is fixed to the ground potential.

Compared with the seventh embodiment, the via 27 (see FIG. 12) can be omitted in the eighth embodiment, and thus the semiconductor IC device 54 can be further miniaturized. Other than that, the advantages of this embodiment are the same as those of the seventh embodiment. However, the base substrate 2 must comprise P-type silicon or a conductive material, because the base substrate 2 has to connect the P$^+$-type silicon layer 3 and the ground potential wiring GND.

Figure 14:
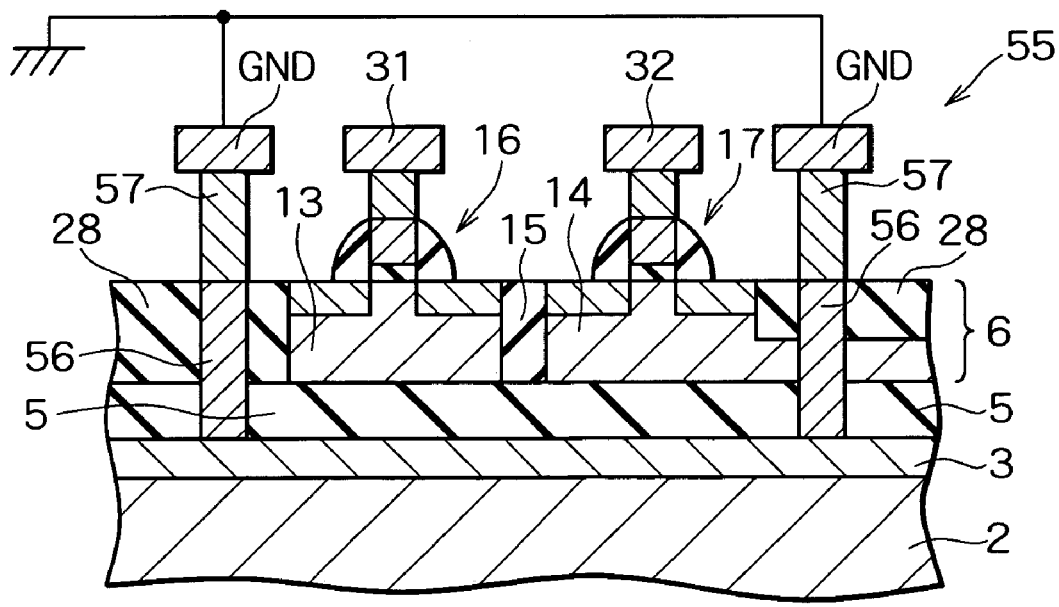
FIG. 14 is a cross-sectional view showing a semiconductor IC device according to a ninth embodiment of the present invention.

Next, a ninth embodiment will be described. FIG. 14 is a cross-sectional view showing a semiconductor IC device 55 according to this embodiment. As shown in FIG. 14, the semiconductor IC device 55 is fabricated by processing the SOI substrate 9 (see FIG. 11). Compared with the semiconductor IC device 53 (see FIG. 12) according to the seventh embodiment, the semiconductor IC device 55 of this embodiment includes a guard ring 56 for encircling the IC including the PMOS transistor 16 and the NMOS transistor 17. The guard ring 56 extends through the BOX layer 5 and the SOI layer 6. The lower end thereof is connected to the P$^+$-type silicon layer 3 and the upper end thereof is exposed in the upper surface of the SOI layer 6. The guard ring 56 comprises, for example, tungsten (W) or doped polysilicon. Accordingly, the IC including the PMOS transistor 16 and the NMOS transistor 17 is three-dimensionally enclosed by the guard ring 56 and the P$^+$-type silicon layer 3. Further, a via 57 is disposed so as to connect the guard ring 56 and the ground potential wiring GND, which is disposed above the SOI layer 6. Other than that, the configuration of the semiconductor IC device 55 is the same as that of the semiconductor IC device 53 according to the seventh embodiment.

In the semiconductor IC device 55 according to this embodiment, by applying a ground potential to the ground potential wiring GND, the ground potential is applied to the guard ring 56 and the P$^+$-type silicon layer 3 through the via 57. Accordingly, the potential of the guard ring 56 and the P⁺-type silicon layer 3 is fixed to the ground potential.

In this embodiment, the guard ring 56 and the P⁺-type silicon layer 3 can absorb noise externally flowing into the IC including the PMOS transistor 16 and the NMOS transistor 17. As a result, malfunction of the IC caused by externally flowing noise can be prevented. Also, propagation of noise generated in the IC to another IC can be prevented. Compared with the seventh embodiment, the device according to the ninth embodiment is a little larger because the guard ring 56 and the P⁺-type silicon layer 3 are arranged so as to three-dimensionally enclose the IC including the PMOS transistor 16 and the NMOS transistor 17. However, noise flown from outside of the IC and noise generated by the IC can be absorbed more effectively. Other than that, the advantages of this embodiment are the same as those of the seventh embodiment.

In this embodiment, a ground potential may be applied to the guard ring 56 and the P⁺-type silicon layer 3 through the base substrate 2, as in the eighth embodiment. In this case, the via 57 can be omitted.

Next, a method for fabricating the SOI substrate according to each of the above-described embodiments will be described. First, a first method for fabricating the SOI substrate will be described. FIGS. 15A to 15D are cross-sectional views showing steps of fabricating the SOI substrate. The first fabricating method corresponds to a method for fabricating the SOI substrate 1 (see FIG. 1) according to the first embodiment.

Figure 15A:
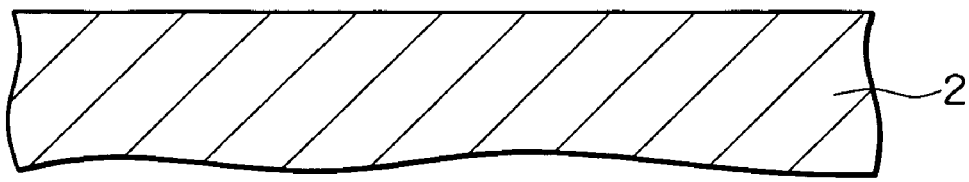
FIGS. 15A to 15D are cross-sectional views showing steps in a first method for fabricating the SOI substrate.
Figure 15B:
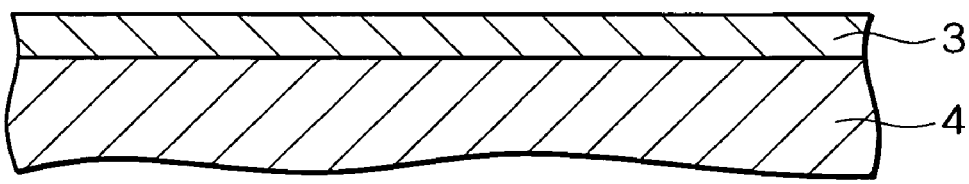
Figure 15C:
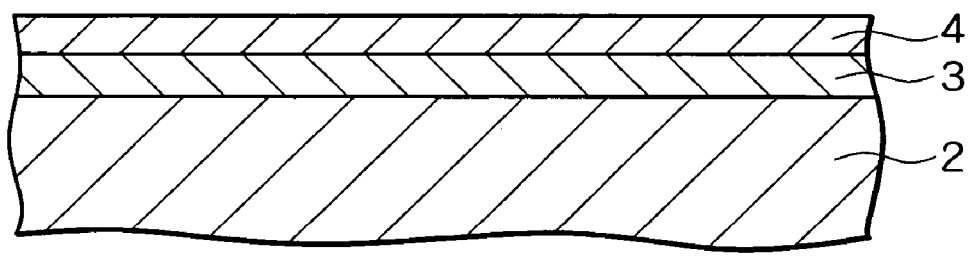
Figure 15D:
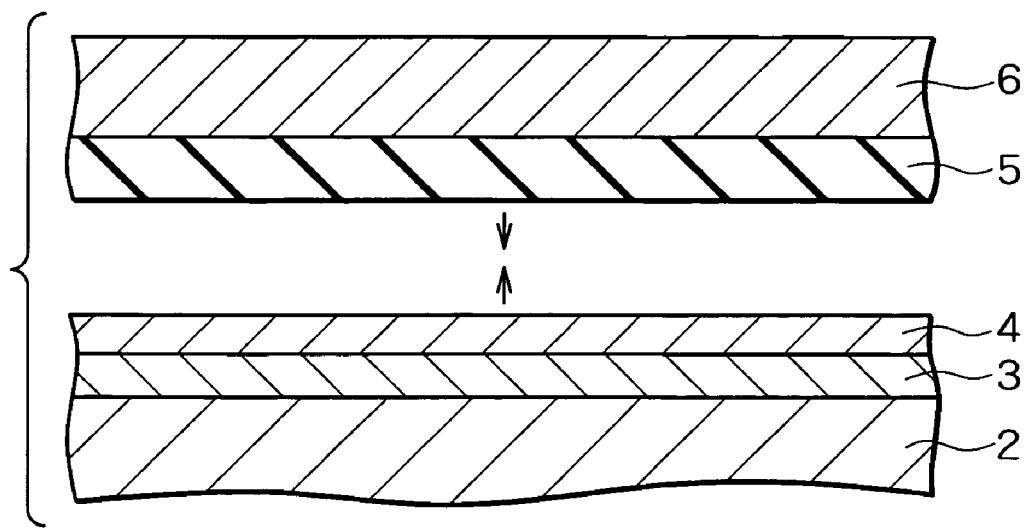

First, as shown in FIG. 15A, the base substrate 2 comprising P⁻-type silicon is prepared. Then, as shown in FIG. 15B, the P⁺-type silicon layer 3 is formed on the entire upper surface of the base substrate 2 by epitaxial growth by using a chemical vapor deposition (CVD) method or the like. Then, as shown in FIG. 15C, the N⁺-type silicon layer 4 is formed on the entire upper surface of the P⁺-type silicon layer 3 by epitaxial growth by using the CVD method or the like. Then, as shown in FIG. 15D, a substrate formed by bonding the BOX layer 5 and the SOI layer 6 is superposed on a substrate including the base substrate 2, the P⁺-type silicon layer 3, and the N⁺-type silicon layer 4, and the both substrates are bonded to each other by heating them. Accordingly, the SOI substrate 1 shown in FIG. 1 is fabricated.

According to the first fabricating method, the P⁺-type silicon layer 3 and the N⁺-type silicon layer 4 are formed by epitaxial growth, and thus the layers having a high crystalline uniformity and a reduced crystal defect can be obtained. As a result, leakage current in the P⁺-type silicon layer 3 and the N⁺-type silicon layer 4 can be reduced.

In the first fabricating method, if the P⁺-type silicon layer 3 is not formed and only the N⁺-type silicon layer 4 is formed on the base substrate 2, the SOI substrate 7 (see FIG. 5) according to the third embodiment can be fabricated. Also, if the N⁺-type silicon layer 4 is not formed and only the P⁺-type silicon layer 3 is formed on the base substrate 2, the SOI substrate 9 (see FIG. 11) according to the seventh embodiment can be fabricated.

Figure 16A:
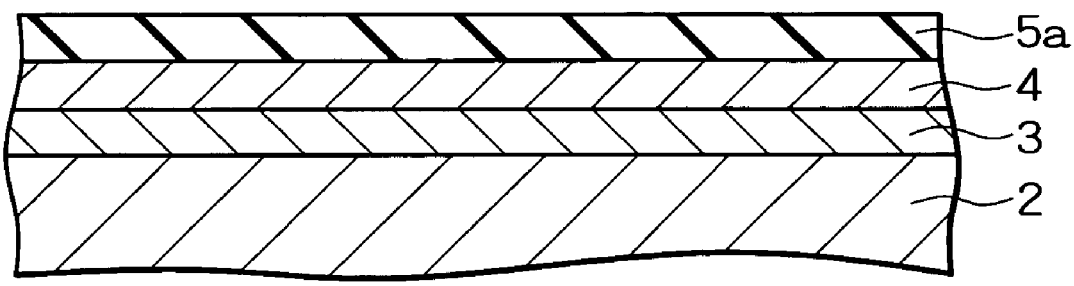
FIGS. 16A and 16B are cross-sectional views showing steps in a second method for fabricating the SOI substrate.
Figure 16B:
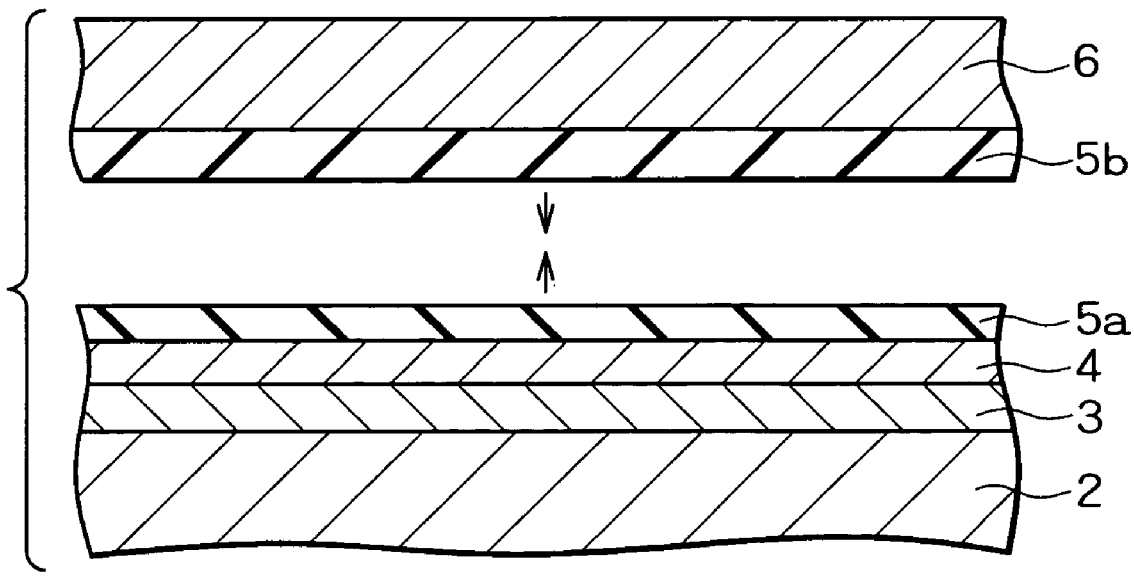

Next, a second method for fabricating the SOI substrate will be described. FIGS. 16A and 16B are cross-sectional views showing steps of fabricating the SOI substrate. The second fabricating method corresponds to a method for fabricating the SOI substrate 1 (see FIG. 1) according to the first embodiment. First, the P⁺-type silicon layer 3 and the N⁺-type silicon layer 4 are formed on the base substrate 2 by epitaxial growth in the method shown in FIGS. 15A to 15C. Then, as shown in FIG. 16A, a silicon oxide film 5a is formed on the N⁺-type silicon layer 4. Then, as shown in FIG. 16B, a substrate formed by bonding a silicon oxide film 5b to the SOI layer 6 is superposed on a substrate including the base substrate 2, the P⁺-type silicon layer 3, the N⁺-type silicon layer 4, and the silicon oxide film 5a, and the both substrates are bonded to each other. At this time, the silicon oxide films 5a and 5b are bonded into one layer, so that the BOX layer 5 can be obtained. Accordingly, the SOI substrate 1 shown in FIG. 1 can be fabricated.

According to the second fabricating method, since the silicon oxide films are bonded to each other, defect does not caused at the bonding interface. Other than that, the advantages of the second fabricating method are the same as those of the first fabricating method.

Figure 17A:
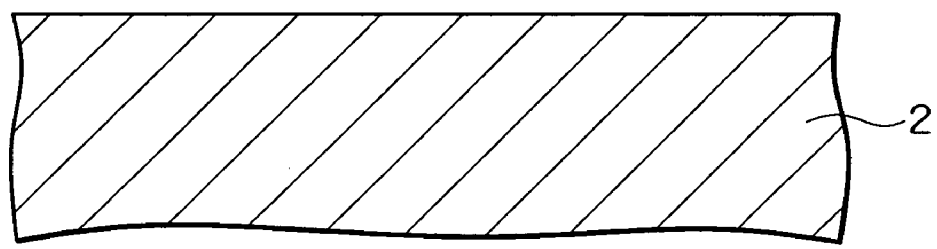
FIGS. 17 to 17C are cross-sectional views showing steps in a third method for fabricating the SOI substrate.
Figure 17B:
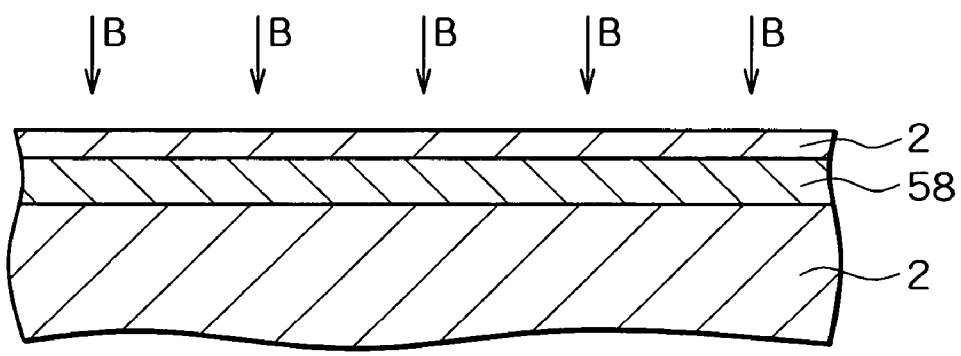
Figure 17C:
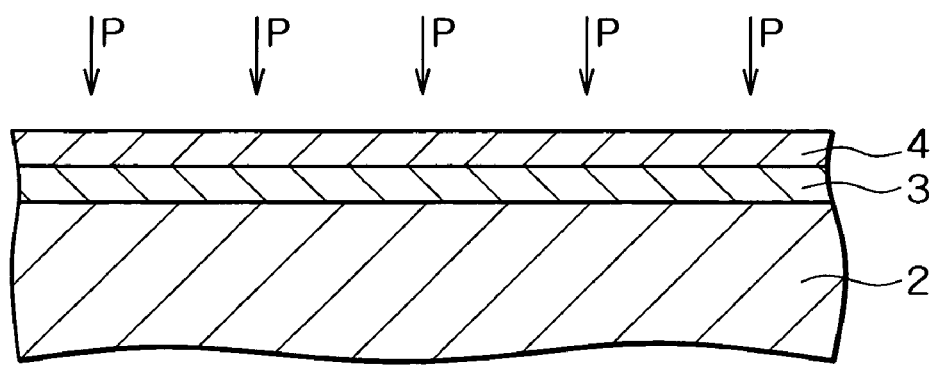

Next, a third method for fabricating the SOI substrate will be described. FIGS. 17A to 17C are cross-sectional views showing steps of fabricating the SOI substrate. The third fabricating method corresponds to a method for fabricating the SOI substrate 1 (see FIG. 1) according to the first embodiment. First, as shown in FIG. 17A, the base substrate 2 comprising P⁻-type silicon is prepared. Then, as shown in FIG. 17B, a P-type impurity such as a boron (B) ion is doped into the base substrate 2. At this time, doping energy is 20 to 100 keV, and a dose is $1 \times 10^{13}$ to $5 \times 10^{13}$ cm⁻². Accordingly, a P⁺-type silicon layer 58 having a thickness of 100 to 500 nm is formed near the upper surface of the base substrate 2. The boron should not be doped into the upper surface of the base substrate 2.

Then, as shown in FIG. 17C, an N-type impurity such as a phosphorus (P) ion is doped into the P⁺-type silicon layer 58. At this time, doping energy is 30 to 150 keV, and a dose is $1 \times 10^{13}$ to $5 \times 10^{13}$ cm⁻². Accordingly, the N⁺-type silicon layer 4 having a thickness of 50 to 200 nm is formed at the upper surface of the P⁺-type silicon layer 58. Also, the lower part of the P⁺-type silicon layer 58, that is, the part which is not changed into the N⁺-type silicon layer 4, is the P⁺-type silicon layer 3.

Then, as shown in FIG. 15D, the substrate formed by bonding the BOX layer 5 and the SOI layer 6 is superposed on the substrate including the base substrate 2, the P⁺-type silicon layer 3, and the N⁺-type silicon layer 4, and the both substrates are bonded to each other by heating them. Accordingly, the SOI substrate 1 shown in FIG. 1 is fabricated.

In the step of doping the P-type impurity shown in FIG. 17B, an indium ion may be doped instead of a boron ion. Also, in the step of doping the N-type impurity shown in FIG. 17C, an arsenic ion or an antimony ion may be doped instead of a phosphorus ion. Further, in the bonding step shown in FIG. 15D, the silicon oxide films may be bonded to each other as in the second fabricating method.

Further, in this fabricating method, by doping an N-type impurity into the base substrate 2 so as to form the N⁺-type silicon layer 4 any by not doping a P-type impurity, the SOI substrate 7 (see FIG. 5) according to the third embodiment can be fabricated. Alternatively, by doping a P-type impurity into the base substrate 2 so as to form the P⁺-type silicon layer 3 and by not doping an N-type impurity, the SOI substrate 9 (see FIG. 11) according to the seventh embodiment can be fabricated.

Further, by doping an N-type impurity into only a part of the upper surface of the base substrate 2, the N⁺-type silicon layer 4 can be locally formed in the upper surface of the base substrate 2, so that the SOI substrate 8 (see FIG. 9) according to the sixth embodiment can be fabricated. In this way, by using ion doping, the N⁺-type silicon layer 4 can be formed in an arbitrary area.

Figure 18:
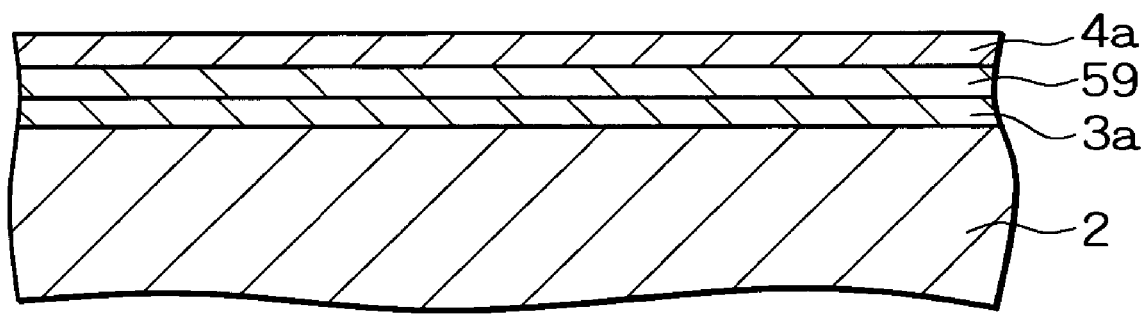
FIG. 18 is a cross-sectional view showing a variation of the third fabricating method.

Next, a variation of the third fabricating method will be described. FIG. 18 is a cross-sectional view showing the fabricating method according to this variation. First, as shown in FIGS. 17A and 17B, a P-type impurity such as a boron ion is doped into the base substrate 2, so as to form the P$^+$-type silicon layer 58 having a thickness of 200 nm at a depth of 50 to 200 nm or more and of 250 to 400 nm or less in the base substrate 2. Then, as shown in FIG. 18, an N-type impurity such as a phosphorus ion is doped into the upper surface of the base substrate 2. At this time, doping energy is 30 to 150 keV, and a dose is $1 \times 10^{13}$ to $5 \times 10^{13}$ cm$^{-2}$. Accordingly, an N$^+$-type silicon layer 4a having a thickness of 50 to 200 nm is formed at the upper surface of the base substrate 2. Also, a silicon layer 59, whose impurity concentration is almost the same as that of the base substrate 2, is formed under the N$^+$-type silicon layer 4a, such that the silicon layer 59 is in contact with the N$^+$-type silicon layer 4a. The thickness of the silicon layer 59 is 100 nm. The lower part of the P$^+$-type silicon layer 58, that is, the part which is not changed into the silicon layer 59, is a P$^+$-type silicon layer 3a. The thickness of the P$^+$-type silicon layer 3a is 100 nm. Accordingly, the P$^+$-type silicon layer 3a, the silicon layer 59, and the N$^+$-type silicon layer 4a are formed in this order on the base substrate 2.

Then, the substrate formed by bonding the BOX layer 5 and the SOI layer 6 is superposed on the substrate including the base substrate 2, the P$^+$-type silicon layer 3a, the silicon layer 59, which has almost the same impurity concentration as that of the base substrate 2, and the N$^+$-type silicon layer 4a, and the both substrates are bonded to each other by heating them, for example, for 30 minutes to 2 hours under the condition of 1000 to 1100° C. In this heating step, impurity contained in the P$^+$-type silicon layer 3a and the N$^+$-type silicon layer 4a diffuses into the silicon layer 59, which has almost the same impurity concentration as that of the base substrate 2, so that the P$^+$-type silicon layer 3a and the lower part of the silicon layer 59 become the P$^+$-type silicon layer 3 and the N$^+$-type silicon layer 4a and the upper part of the silicon layer 59 become the N$^+$-type silicon layer 4. Also, a PN junction is formed between the P$^+$-type silicon layer 3 and the N$^+$-type silicon layer 4. Accordingly, the SOI substrate 1 shown in FIG. 1 is fabricated. Other than that, the fabricating method according to this variation is the same as the third fabricating method.

Figure 19A:
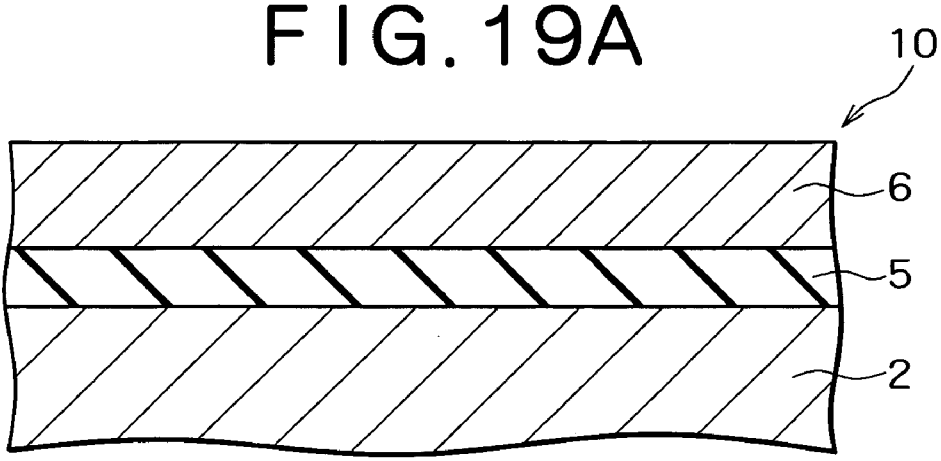
FIGS. 19A to 19C are cross-sectional views showing steps in a fourth method for fabricating the SOI substrate.
Figure 19B:
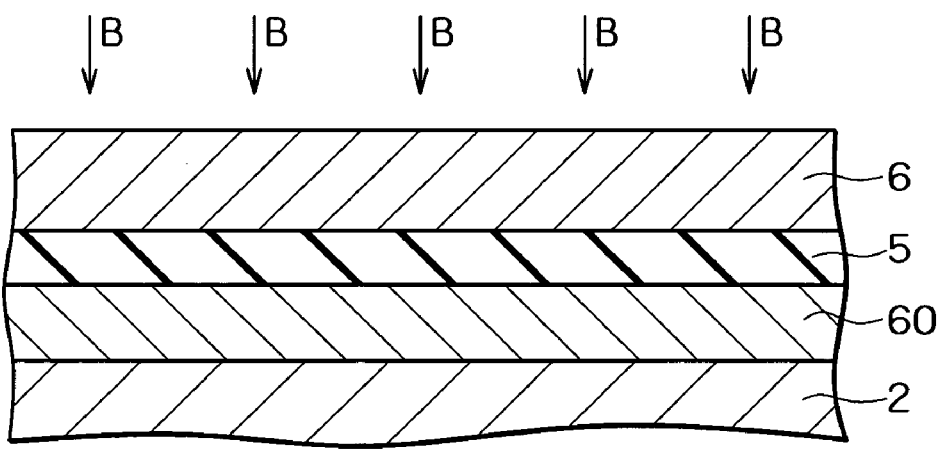
Figure 19C:
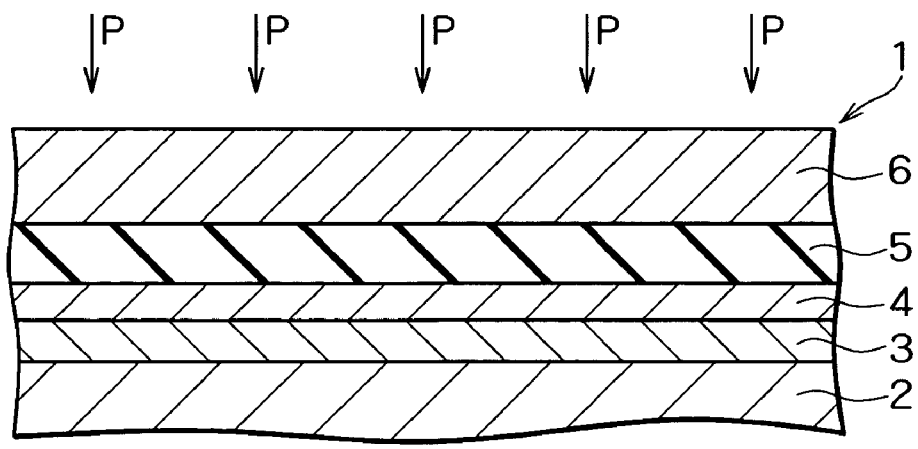

Next, a fourth method for fabricating the SOI substrate will be described. FIGS. 19A to 19C are cross-sectional views showing steps of fabricating the SOI substrate. The fourth fabricating method corresponds to a method for fabricating the SOI substrate 1 (see FIG. 1) according to the first embodiment. First, as shown in FIG. 19A, the BOX layer 5 is formed on the entire upper surface of the base substrate 2 comprising P$^-$-type silicon and the SOI layer 6 is formed on the BOX layer 5, so as to prepare an SOI substrate 10 by an ordinary method. Then, as shown in FIG. 19B, a P-type impurity such as a boron (B) ion is doped into the SOI substrate 10. At this time, doping energy is 50 to 200 keV, and a dose is $1 \times 10^{13}$ to $5 \times 10^{13}$ cm$^{-2}$. Accordingly, the boron ion passes through the SOI layer 6 and the BOX layer 5 so as to reach the upper surface of the base substrate 2, and a P$^+$-type silicon layer 60 having a thickness of 100 to 400 nm is formed in the upper surface of the base substrate 2.

Then, as shown in FIG. 19C, an N-type impurity such as a phosphorus (P) ion is doped into the SOI substrate 10. The doping energy is 100 to 300 keV, and a dose is $1 \times 10^{13}$ to $5 \times 10^{13}$ cm$^{-2}$. Accordingly, the N$^+$-type silicon layer 4 having a thickness of 50 to 200 nm is formed in the upper surface of the P$^+$-type silicon layer 60. The lower part of the P$^+$-type silicon layer 60, that is, the part which is not changed into the N$^+$-type silicon layer 4, is the P$^+$-type silicon layer 3. Accordingly, the SOI substrate 1 is fabricated.

In this fabricating method, if only an N-type impurity is doped into the base substrate 2 so as to form the N$^+$-type silicon layer 4 and if a P-type impurity is not doped, the SOI substrate 7 (see FIG. 5) according to the third embodiment can be fabricated. Alternatively, if only a P-type impurity is doped into the base substrate 2 so as to form the P$^+$-type silicon layer 3 and if an N-type impurity is not doped, the SOI substrate 9 (see FIG. 11) according to the seventh embodiment can be fabricated. Further, by doping an N-type impurity into a part of the upper surface of the base substrate 2, the N$^+$-type silicon layer 4 can be locally formed in the upper surface of the base substrate 2, so that the SOI substrate 8 (see FIG. 9) according to the sixth embodiment can be fabricated. Further, if impurity concentration varies in a part of the SOI layer 6 due to ion doping, so that the part changes to N/P-type or N-type, the original impurity concentration can be obtained by adequately adjusting the concentration when a well or the like is formed in a following step.

Figure 20A:
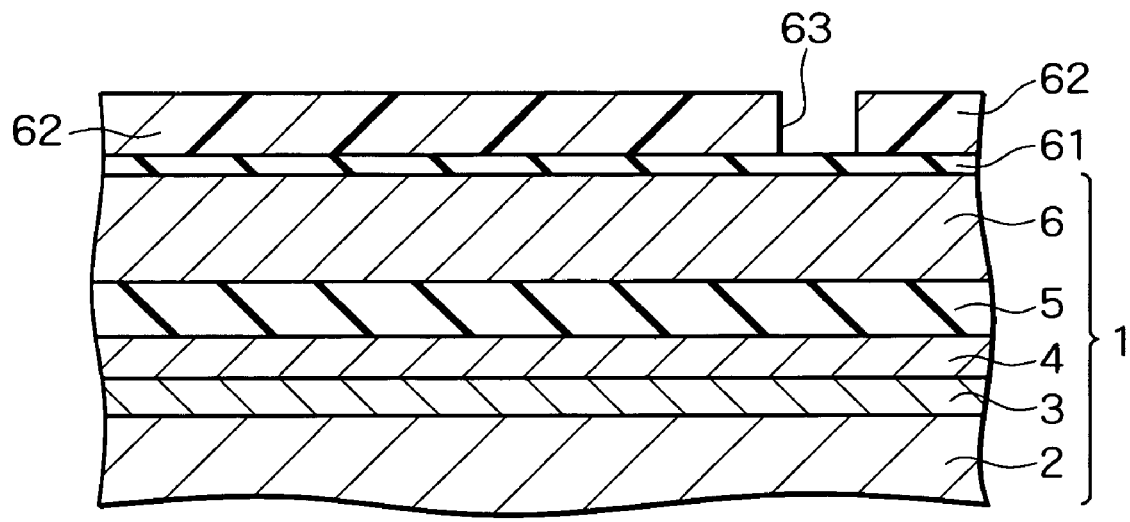
FIGS. 20A and 20B are cross-sectional views showing steps in a first method for fabricating the semiconductor IC device.
Figure 20B:
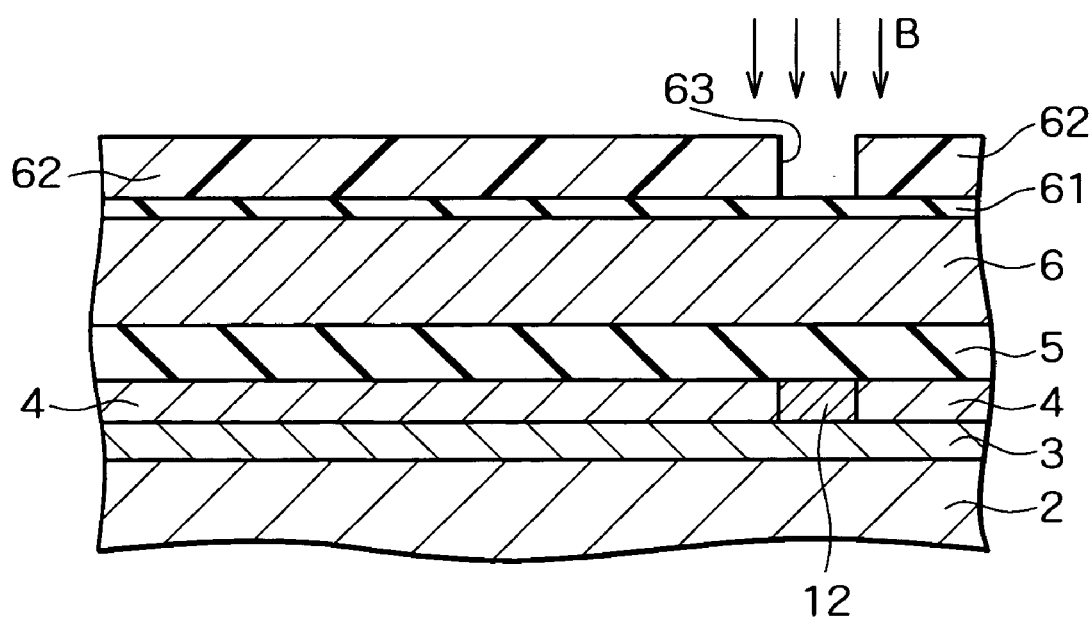

Next, a method for fabricating the semiconductor IC device according to each of the above-described embodiments will be described. First, a first method for fabricating the semiconductor IC device will be described. FIGS. 20A and 20B are cross-sectional views showing steps of fabricating the semiconductor IC device. This fabricating method corresponds to a method for fabricating the semiconductor IC device 11 (see FIGS. 2A and 2B) according to the first embodiment.

First, as shown in FIG. 1, the SOI substrate 1 is fabricated by using any of the above-described methods. Then, as shown in FIG. 20A, an oxide film 61 is formed on the entire upper surface of the SOI substrate 1. The oxide film 61 protects the upper surface of the SOI substrate 1, and has a thickness of several tens of nm. Then, a photoresist 62 is formed on the oxide film 61, and exposure and development are performed for patterning. At this time, an opening 63 is formed in an area where the P$^+$-type silicon layer 12 is to be formed in the following step in the photoresist 62.

Then, as shown in FIG. 20B, a P-type impurity such as a boron ion is doped into the SOI substrate 1 by using the photoresist 62 as a mask. Accordingly, part of the N$^+$-type silicon layer 4 changes into P$^+$-type, so that the P$^+$-type silicon layer 12 is formed. Then, the photoresist 62 is removed. Alternatively, the oxide film 61, the SOI layer 6, and the BOX layer 5 may be selectively removed by etching by using the photoresist 62 as a mask so as to form an opening extending to the N$^+$-type silicon layer 4, and a P-type impurity may be doped through the opening so as to form the P$^+$-type silicon layer 12.

Then, as shown in FIG. 2B, the oxide film 61 is removed and the STI region 28 is selectively formed in the upper surface of the SOI substrate 6, and then the element separating film 15 is selectively formed such that it extends to the BOX layer 5. Then, ion is doped into the SOI layer 6 so as to form the N well 13 and the P well 14. Further, the PMOS transistor 16 and the NMOS transistor 17 are formed based on the N well 13 and the P well 14, respectively, and they are embedded by an insulating film (not shown). Then, the vias 26 and 27 are formed so that the vias extend through the insulating film, the SOI layer 6, and the BOX layer 5. Further, the power-supply potential wiring VDD and the ground potential wiring GND are connected to the upper ends of the vias 26 and 27, respectively. Accordingly, the semiconductor IC device 11 is fabricated.

Figure 21A:
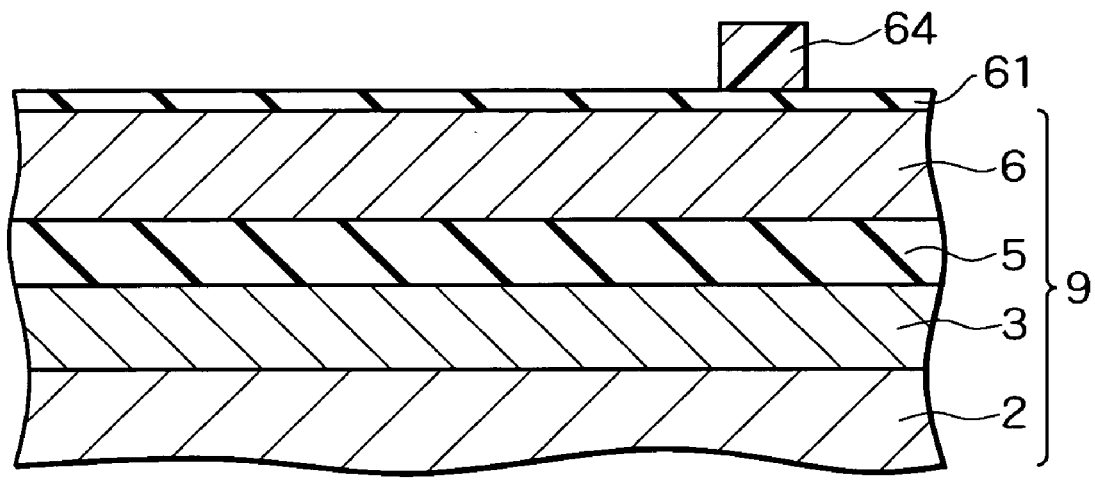
FIGS. 21A and 21B are cross-sectional views showing steps in a second method for fabricating the semiconductor IC device.
Figure 21B:
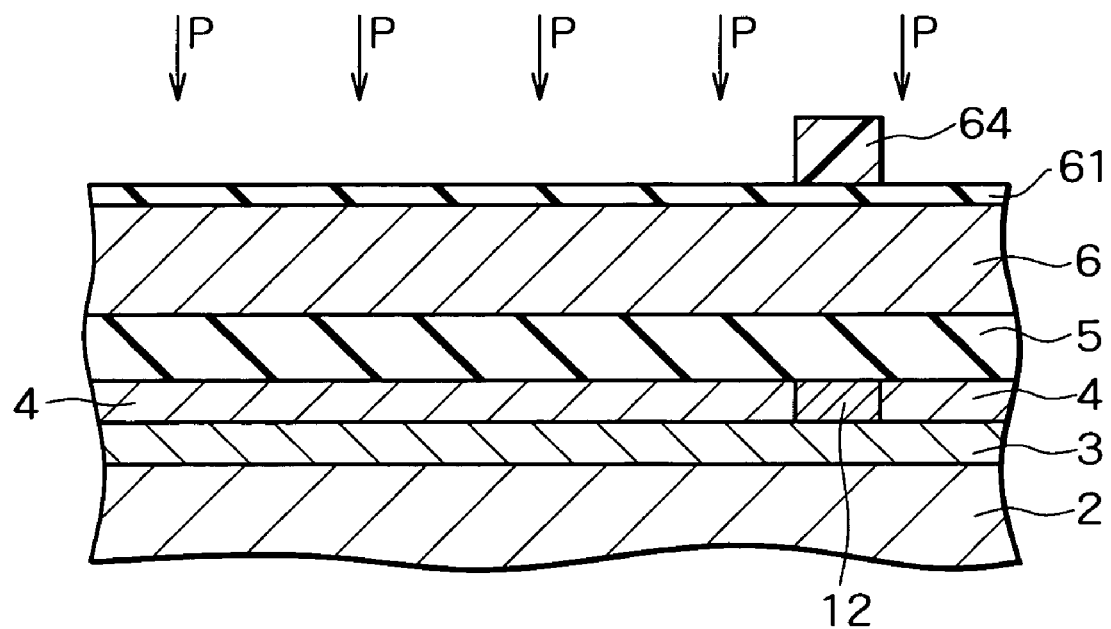

Next, a second method for fabricating the semiconductor IC device will be described. FIGS. 21A and 21B are cross-sectional views showing steps of fabricating the semiconductor IC device. This fabricating method corresponds to a method for fabricating the semiconductor IC device 11 (see FIGS. 2A and 2B) according to the first embodiment.

First, as shown in FIG. 11, the SOI substrate 9 is fabricated by using any of the above-described methods. Then, as shown in FIG. 21A, an oxide film 61 is formed on the entire upper surface of the SOI substrate 9 and a photoresist 64 is formed on the oxide film 61. Then, exposure and development are performed to the photoresist 64 and the photoresist 64 is patterned so as to cover an area where the $P^+$-type silicon layer 12 will is to be formed in the following step.

Then, as shown in FIG. 21B, an N-type impurity such as a phosphorus ion is doped into the SOI substrate 9 by using the photoresist 64 as a mask. An arsenic ion or an antimony ion may be used instead of the phosphorus ion. Accordingly, an upper part of the $P^+$-type silicon layer 3 is changed into an $N^+$-type silicon layer, so that the $N^+$-type silicon layer 4 is formed. At this time, a part which is in the same layer as the $N^+$-type silicon layer 4 and which is not changed into the $N^+$-type silicon layer 4 so as to be remained as a $P^+$-type is the $P^+$-type silicon layer 12. Then, the photoresist 64 is removed.

Then, by using the same method as the first method for fabricating the semiconductor IC device, the element separating film 15, the PMOS transistor 16, the NMOS transistor 17, the STI region 28, the vias 26 and 27, the power-supply potential wiring VDD, and the ground potential wiring GND are formed, so as to fabricate the semiconductor IC device 11.

In a step of doping a P-type impurity shown in FIG. 21B of this fabricating method, part of the SOI layer 6 may be changed into N-type. In that case, by adjusting a condition of doping an impurity in a step of forming the N well 13 and the P well 14, the final impurity concentration is adjusted.

In the first and second methods for fabricating the semiconductor IC device, if the back surface of the base substrate 2 is connected to the ground potential wiring GND without forming the via 27, the semiconductor IC device 41 according to the second embodiment can be fabricated.

Figure 22A:
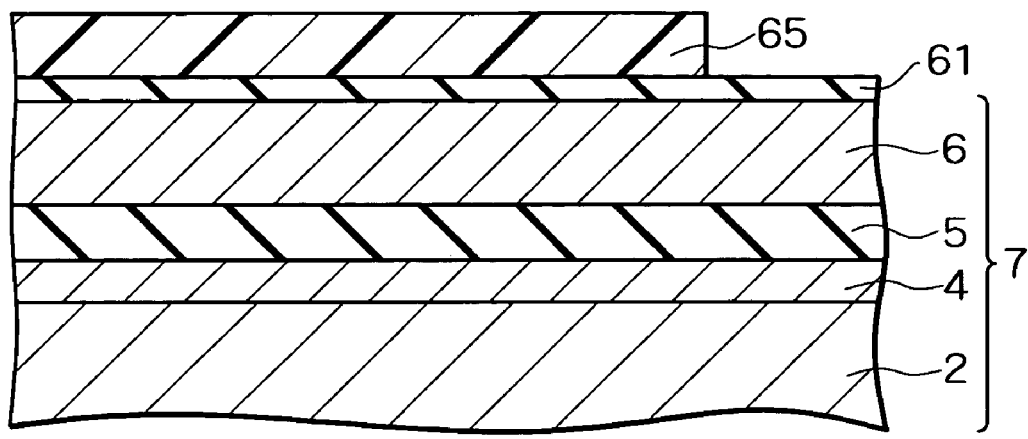
FIGS. 22A and 22B are cross-sectional views showing steps in a third method for fabricating the semiconductor IC device.
Figure 22B:
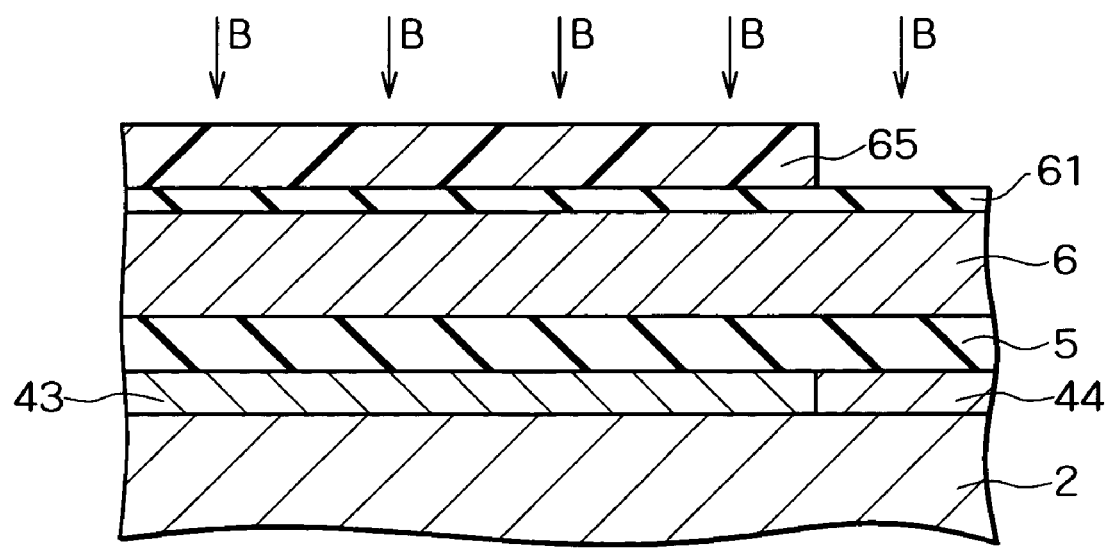

Next, a third method for fabricating the semiconductor IC device will be described. FIGS. 22A and 22B are cross-sectional views showing the third fabricating method. This method corresponds to a method for fabricating the semiconductor IC device 42 (see FIGS. 6A and 6B) according to the third embodiment.

First, as shown in FIG. 5, the SOI substrate 7 is prepared by using any of the above-described methods. Then, as shown in FIG. 22A, an oxide film 61 is formed on the entire upper surface of the SOI substrate 7, and a photoresist 65 is formed on the oxide film 61. Then, exposure and development are performed to the photoresist 65, so as to pattern the photoresist 65. At this time, the photoresist 65 is patterned so as to cover the area where the $N^+$-type silicon layer 43 (see FIG. 22B) is to be formed in the following step. As shown in FIG. 6B, each of the $N^+$-type silicon layer 43 and the $P^+$-type silicon layer 44 is comb-shaped when viewed from the vertical direction with respect to the upper surface of the base substrate 2, and the both layers 43 and 44 contact each other.

Next, as shown in FIG. 22B, a P-type impurity such as a boron ion is doped into the SOI substrate 7 by using the photoresist 65 as a mask. Accordingly, part of the $N^+$-type silicon layer 4 changes into $P^+$-type, so that the $P^+$-type silicon layer 44 is formed. At this time, in the $N^+$-type silicon layer 4, the part which has not been changed into the $P^+$-type silicon layer 44 so as to be remained as $N^+$-type is the $N^+$-type silicon layer 43. Then, the photoresist 65 is removed.

Then, by using the same method as the first method for fabricating the semiconductor IC device, the element separating film 15, the PMOS transistor 16, the NMOS transistor 17, the STI region 28, the vias 26 and 27, the power-supply potential wiring VDD, the ground potential wiring GND, and so on are formed, so as to fabricate the semiconductor IC device 42 (see FIGS. 6A and 6B) according to the third embodiment.

Alternatively, in order to fabricate the semiconductor IC device 42 according to the third embodiment, the SOI substrate 9 (see FIG. 11) may be used, the area where the $P^+$-type silicon layer 44 (see FIG. 6A) is to be formed may be covered by a photoresist, and the $N^+$-type silicon layer 43 may be formed by doping an N-type impurity by using the photoresist as a mask. This method may also be adopted for fabricating the semiconductor IC device 42.

In the third fabricating method, by forming the base substrate 2 comprising $P^-$-type silicon, doping a P-type impurity so as to change part of the $N^+$-type silicon layer 4 into the $P^+$-type silicon layer 46 (see FIG. 7), and applying a ground potential to the base substrate 2 through the ground potential wiring GND, the via 27, and the $P^+$-type silicon layer 46, the semiconductor IC device 45 (see FIG. 7) according to the fourth embodiment can be fabricated.

Figure 23A:
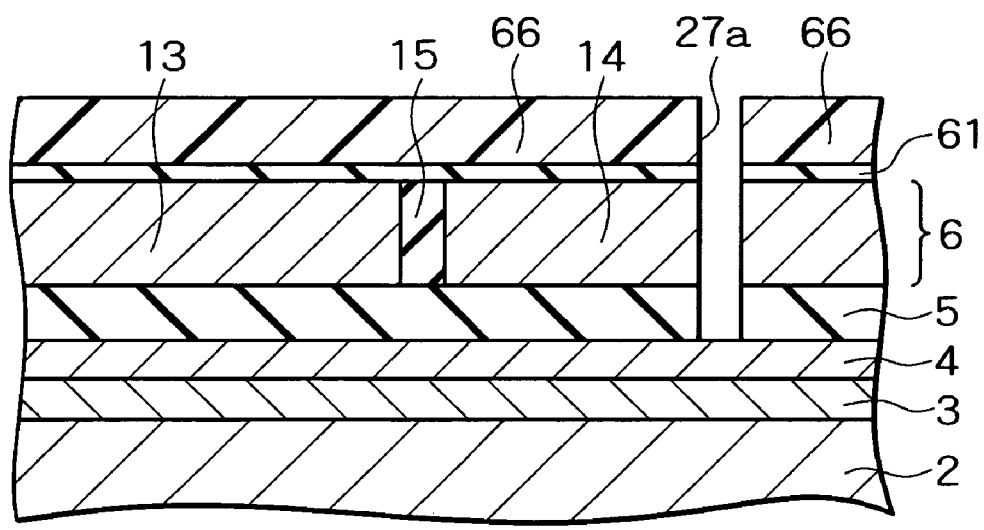
FIGS. 23A and 23B are cross-sectional views showing steps in a fourth method for fabricating the semiconductor IC device.
Figure 23B:
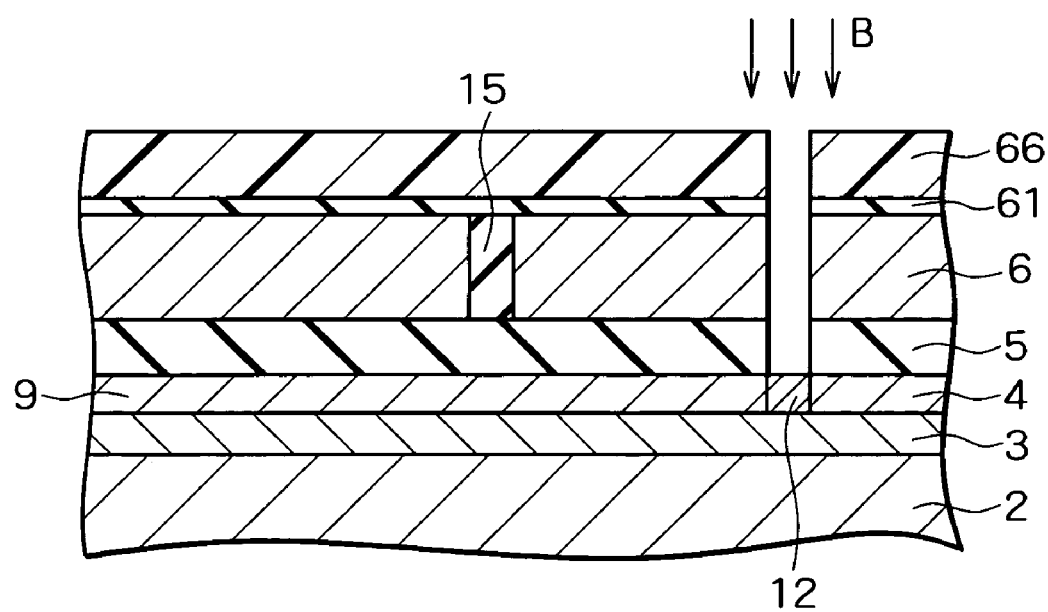

Next, a fourth method for fabricating the semiconductor IC device will be described. FIGS. 23A and 23B are cross-sectional views showing steps of this fabricating method. This fabricating method corresponds to a method for fabricating the semiconductor IC device 11 (see FIGS. 2A and 2B) according to the first embodiment.

First, as shown in FIG. 1, the SOI substrate 1 is prepared by any of the above-described methods. Then, as shown in FIG. 23A, the N well 13, the P well 14, and the element separating film 15 are formed in the SOI layer 6 by an ordinary method. Then, the oxide film 61 is formed on the entire upper surface of the SOI layer 6. Then, a photoresist 66 is formed on the oxide film 61 and patterning is performed. Then, etching is performed by using the photoresist 66 as a mask, so as to form a via hole 27a which extends through the oxide film 61, the P well 14, and the BOX layer 5.

Then, as shown in FIG. 23B, a P-type impurity such as a boron ion is doped by using the photoresist 66 as a mask. At this time, the doping energy of the boron ion is 10 to 50 keV, and a dose is $1 \times 10^{15}$ cm$^{-2}$. The P-type impurity reaches the $N^+$-type silicon layer 4 through the via hole 27a and part of the $N^+$-type silicon layer 4 is changed into $P^+$-type, so that the $P^+$-type silicon layer 12 is formed. Then, the photoresist 66 is removed.

Then, by using the same method as the first method, the PMOS transistor 16, the NMOS transistor 17, the STI region 28, the vias 26 and 27, the power-supply potential wiring VDD, the ground potential wiring GND, and so on are formed, so as to fabricate the semiconductor IC device 11.

Next, a fifth method for fabricating the semiconductor IC device will be described. This fabricating method corresponds to a method for fabricating the semiconductor IC device 47 (see FIG. 8) according to the fifth embodiment. First, as shown in FIG. 5, the SOI substrate 7 is prepared by using any of the above-described methods. Then, as shown in FIG. 8, the PMOS transistor 16, the NMOS transistor 17, the via 26, and so on are formed by the same method as the first fabricating method, so that the $N^+$-type silicon layer 4 is connected to the power-supply potential wiring VDD through the via 26. The base substrate 2 is connected to the ground potential wiring GND. Accordingly, the semiconductor IC device 47 can be fabricated.

By using the SOI substrate 8 (see FIG. 9) instead of the SOI substrate 7 in the fifth fabricating method, the semiconductor IC device 48 (see FIG. 10) according to the sixth embodiment can be fabricated. Also, by using the SOI substrate 9 (see FIG. 11) and forming the via 27 which is connected to the ground potential wiring GND, the semiconductor IC device 53 (see FIG. 12) according to the seventh embodiment can be fabricated. In this case, the base substrate 2 need not be connected to the ground potential wiring GND. Further, by using the SOI substrate 9, omitting the via 27, and connecting the base substrate 2 to the ground potential wiring GND, the semiconductor IC device 54 (see FIG. 13) according to the eight embodiment can be formed. Still further, by using the SOI substrate 9, forming the guard ring 56 (see FIG. 14) in the BOX layer 5 and the SOI layer 6, and by connecting the guard ring 56 to the ground potential wiring GND, the semiconductor IC device 55 (see FIG. 14) according to the ninth embodiment can be formed.

What is claimed is:

1. An SOI structure comprising: a substrate comprising a first semiconductor layer of a first conductivity type disposed in said substrate, and a second semiconductor layer of a second conductivity type which is disposed in said substrate below said first semiconductor layer, an upper surface of said second semiconductor layer contacting said first semiconductor layer substantially in an entire upper surface of said second semiconductor layer; an insulating film disposed on said substrate, an upper surface of said first semiconductor layer contacting said insulating film substantially in an entire upper surface of said first semiconductor layer; a semiconductor region disposed on said insulating film; and a third semiconductor layer of a second conductivity type which is disposed in said substrate below said first and second semiconductor layers, wherein an impurity concentration of said second semiconductor layer is higher than that of said third semiconductor layer, wherein the second semiconductor layer is disposed on the entire upper surface of the third semiconductor layer, and the first semiconductor layer is disposed on the entire upper surface of the second semiconductor layer.

2. An SOI structure according to claim 1, wherein the third semiconductor layer comprises a semiconductor having a lower impurity concentration than that in the first and second semiconductor layers.

3. An SOI structure according to claim 1, wherein the second semiconductor layer is formed by epitaxial growth.

4. An SOI structure according to claim 1, wherein the second semiconductor layer is formed by doping an impurity into the third semiconductor layer.

5. An SOI structure according to claim 1, wherein the first semiconductor layer is formed by epitaxial growth.

6. An SOI structure according to claim 1, wherein the first semiconductor layer is formed by doping an impurity into the second semiconductor layer.

7. An SOI structure according to claim 1, wherein the first semiconductor layer has a higher impurity concentration than that of the third semiconductor layer.

8. A semiconductor integrated circuit device comprising: a substrate comprising a first semiconductor layer of a first conductivity type disposed in said substrate, and a second semiconductor layer of a second conductivity type which is disposed in said substrate below said first semiconductor layer, an upper surface of said second semiconductor layer contacting said first semiconductor layer substantially in an entire upper surface of said second semiconductor layer; a first potential being applied to the first semiconductor layer; an insulating film disposed on said substrate; an upper surface of said first semiconductor layer contacting said insulating film substantially in an entire upper surface of said first semiconductor layer; a semiconductor region disposed on the insulating film; a third semiconductor layer of a second conductivity type which is disposed in said substrate below said first and second semiconductor layers, and an integrated circuit disposed in the semiconductor region, wherein an impurity concentration of said second semiconductor layer is higher than that of said third semiconductor layer, wherein a second potential is being applied to said second semiconductor layer, wherein a decoupling capacitor is formed between said first and second semiconductor layers, wherein the second semiconductor layer is disposed on the entire upper surface of the third semiconductor layer, and the first semiconductor layer is disposed on the entire upper surface of the second semiconductor layer.

9. A semiconductor integrated circuit device according to claim 8, further comprising a via which extends through the semiconductor region and the insulating film and which is connected to the first semiconductor layer, wherein the first potential is applied to the first semiconductor layer through the via.

10. A semiconductor integrated circuit device according to claim 8, wherein the first potential is applied to the first semiconductor layer through the second semiconductor layer.

11. A semiconductor integrated circuit device according to claim 8, wherein a second potential is applied to the second semiconductor layer, and a decoupling capacitor is formed between the second semiconductor layer and the first semiconductor layer.

12. A semiconductor integrated circuit device according to claim 11, further comprising a first via which extends through the semiconductor region and the insulating film and which is connected to the first semiconductor layer, wherein the first potential is applied to the first semiconductor layer through the first via.

13. A semiconductor integrated circuit device according to claim 11, further comprising:

a conductive contact region disposed in the same layer as the first semiconductor layer; and a second via which extends through the semiconductor region and the insulating film and which is connected to the contact region, wherein the second potential is applied to the second semiconductor layer through the contact region and the second via.

14. A semiconductor integrated circuit device according to claim 11, wherein the second potential is applied to the second semiconductor layer through the back surface thereof.

15. A semiconductor integrated circuit device according to claim 8, further comprising a first via which extends through the semiconductor region and the insulating film and which is connected to the first semiconductor layer, wherein the first potential is applied to the first semiconductor layer through the first via.

16. A semiconductor integrated circuit device according to claim 8, further comprising a contact region of the second conductivity type disposed in the same layer as the first semiconductor layer; and a second via which extends through the semiconductor region and the insulating film and which is connected to the contact region, wherein the second potential is applied to the second semiconductor layer through the contact region and the second via.

17. A semiconductor integrated circuit device according to claim 8, wherein the second potential is applied to the second semiconductor layer through the third semiconductor layer.

18. A semiconductor integrated circuit device according to claim 8, wherein the third semiconductor layer has a lower impurity concentration than that in the first and second semiconductor layers.

19. A semiconductor integrated circuit device according to claim 8, wherein the second semiconductor layer is formed by epitaxial growth.

20. A semiconductor integrated circuit device according to claim 8, wherein the second semiconductor layer is formed by doping an impurity into the third semiconductor layer.

21. A semiconductor integrated circuit device according to claim 8, wherein the first semiconductor layer is formed by epitaxial growth.

22. A semiconductor integrated circuit device according to claim 8, wherein the first semiconductor layer is formed by doping an impurity into the third semiconductor layer.

23. A semiconductor integrated circuit device SOI according to claim 8, wherein the first semiconductor layer has a higher impurity concentration than that of the third semiconductor layer.

* * * * *